(12) United States Patent
Vera Villarroel et al.

(10) Patent No.: US 11,133,874 B2
(45) Date of Patent: Sep. 28, 2021

(54) PAM-BASED CODING SCHEMES FOR PARALLEL COMMUNICATION

(71) Applicant: Nokia Solutions and Networks Oy, Espoo (FI)

(72) Inventors: Ariel Leonardo Vera Villarroel, Florham Park, NJ (US); Gerhard Kramer, Munich (DE)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 16/752,542

(22) Filed: Jan. 24, 2020

(65) Prior Publication Data

US 2021/0234618 A1  Jul. 29, 2021

(51) Int. Cl.
*H04B 14/02* (2006.01)
*H03K 19/21* (2006.01)
*H03K 19/20* (2006.01)

(52) U.S. Cl.
CPC ........... *H04B 14/023* (2013.01); *H03K 19/20* (2013.01); *H03K 19/21* (2013.01)

(58) Field of Classification Search
CPC .......... H04L 25/4917; H04L 25/0272
USPC ........................................ 375/353
See application file for complete search history.

(56) References Cited

U.S. PATENT DOCUMENTS

| | | | |
|---|---|---|---|
| 9,258,154 B2* | 2/2016 | Hormati | H04L 25/0272 |
| 9,288,089 B2* | 3/2016 | Cronie | H04L 25/0272 |
| 9,401,828 B2 | 7/2016 | Cronie et al. | |
| 9,413,384 B1* | 8/2016 | Tajalli | H03K 17/6871 |
| 9,450,744 B2* | 9/2016 | Simpson | H04L 25/0272 |
| 9,479,369 B1 | 10/2016 | Shokrollahi | |
| 9,544,015 B2* | 1/2017 | Ulrich | H03K 19/0013 |
| 9,929,818 B2 | 3/2018 | Holden et al. | |
| 10,686,583 B2* | 6/2020 | Ulrich | H04L 25/14 |
| 2002/0114402 A1* | 8/2002 | Doetsch | H04L 1/0068 |
| | | | 375/265 |

(Continued)

OTHER PUBLICATIONS

International Search Report and Written Opinion for corresponding International application No. PCT/IB2021/050303; dated Apr. 7, 2021 (13 pages).

*Primary Examiner* — Shuwang Liu
*Assistant Examiner* — Gina M McKie
(74) *Attorney, Agent, or Firm* — Mendelsohn Dunleavy, P.C.; Steve Mendelsohn

(57) ABSTRACT

Encoders and decoders for encoding and decoding data according to a coding scheme. The encoder converts N bits of input data into M voltage signals for transmission over M parallel wires to a decoder having one or two decoding stages that recover the N bits of data from the M voltage signals. The coding scheme is an N-bit, M-wire PAM-Q code in which each voltage signal $w_i$ has one of Q voltage levels $l_1$-$l_Q$, where $l_1 < l_2 < \ldots < l_Q$, and the different sets of M voltage signals for the different N-bit input values are permutations of a single set of M voltage signals. The decoder has a comparator stage. For the decoder having one other decoding stage, the other decoding stage is a computation stage or a logic stage that is before or after the comparator stage.

30 Claims, 19 Drawing Sheets

(56) References Cited

U.S. PATENT DOCUMENTS

2017/0147520 A1 5/2017 Shokrollahi
2019/0303340 A1 10/2019 Lee et al.

* cited by examiner

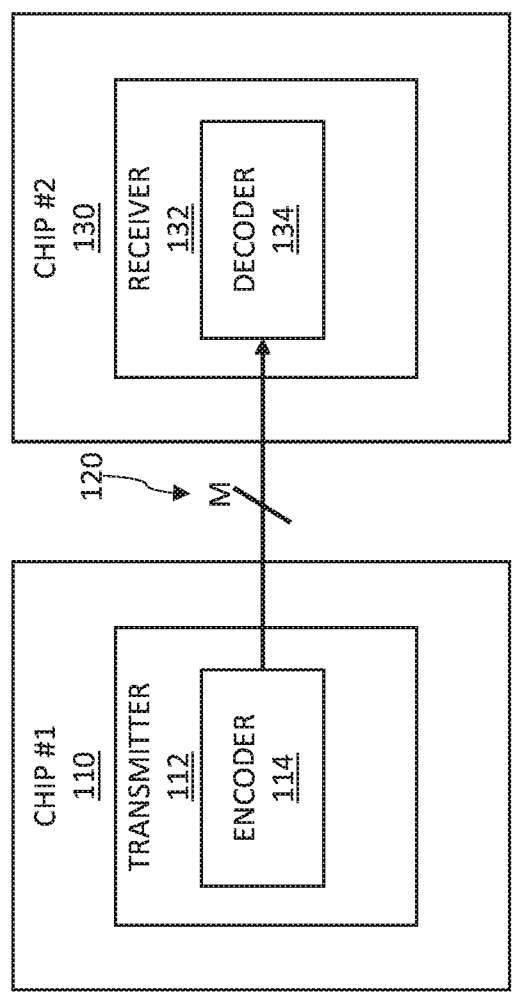

410

420

420

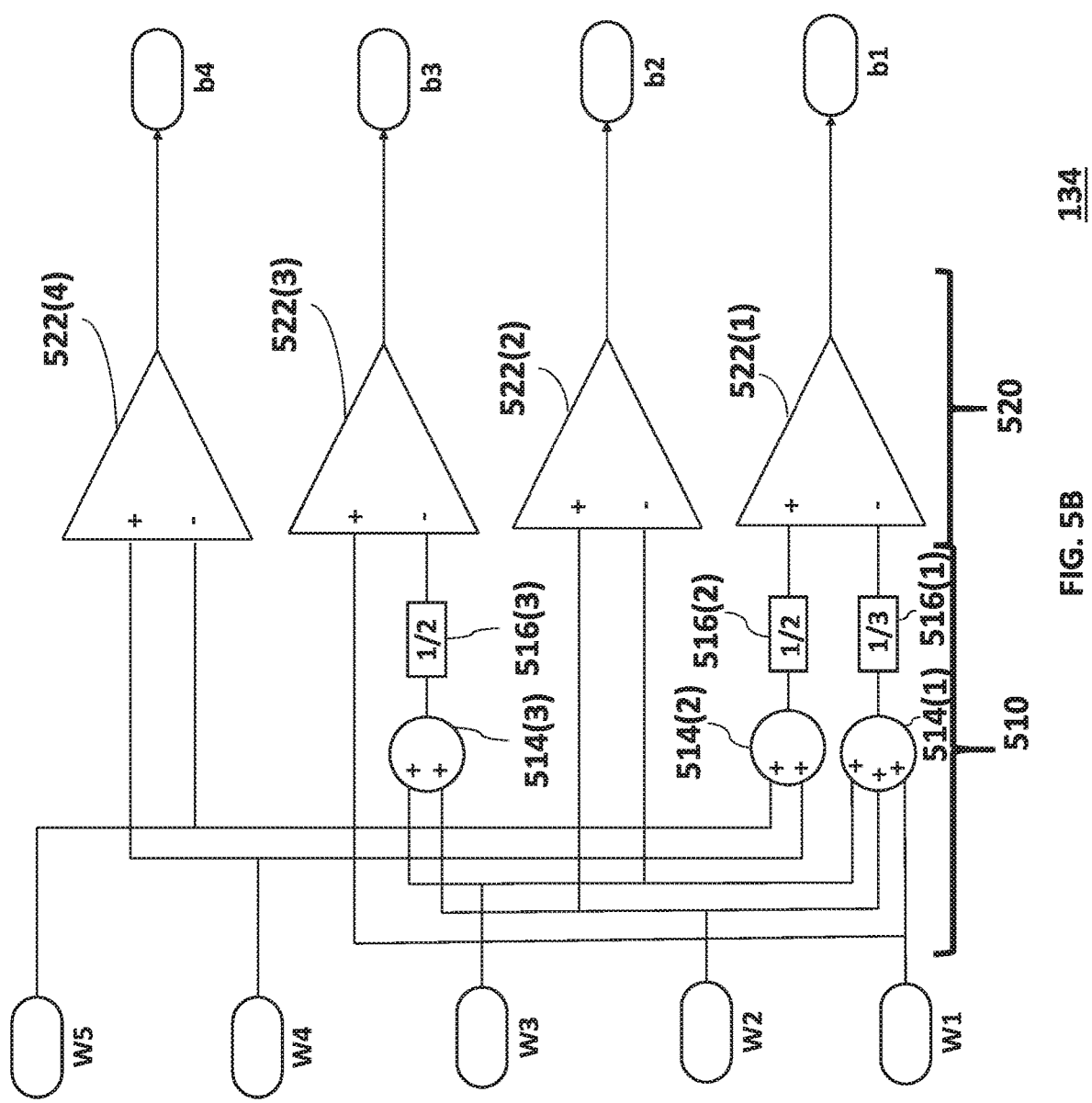

620

PAM-BASED CODING SCHEMES FOR PARALLEL COMMUNICATION

BACKGROUND

Field of the Disclosure

The present disclosure relates to communications and, more specifically but not exclusively, to PAM-based coding schemes for parallel communication between integrated circuit chips.

Description of the Related Art

This section introduces aspects that may help facilitate a better understanding of the disclosure. Accordingly, the statements of this section are to be read in this light and are not to be understood as admissions about what is prior art or what is not prior art.

It is known to use pulse amplitude modulation (PAM) coding schemes to encode data for transmission from one integrated circuit (IC) chip to another IC chip via a parallel communication bus. Such PAM-based coding schemes have been designed with an emphasis on the reduction of inter-symbol interference (ISI) in order to provide high-speed communications.

SUMMARY

The present disclosure describes PAM-based coding schemes that can be applied to chip-to-chip communications via a parallel communication bus that are designed to achieve high-speed communications while also providing low power consumption, small IC footprints, and low I/O pin count.

BRIEF DESCRIPTION OF THE DRAWINGS

Embodiments of the disclosure will become more fully apparent from the following detailed description, the appended claims, and the accompanying drawings in which like reference numerals identify similar or identical elements.

FIG. 1 is a simplified block diagram of a hardware configuration that supports chip-to-chip communication;

FIG. 5B is a schematic circuit diagram of the decoder 134 of FIG. 5A according to an implementation;

DETAILED DESCRIPTION

Figure 2A:
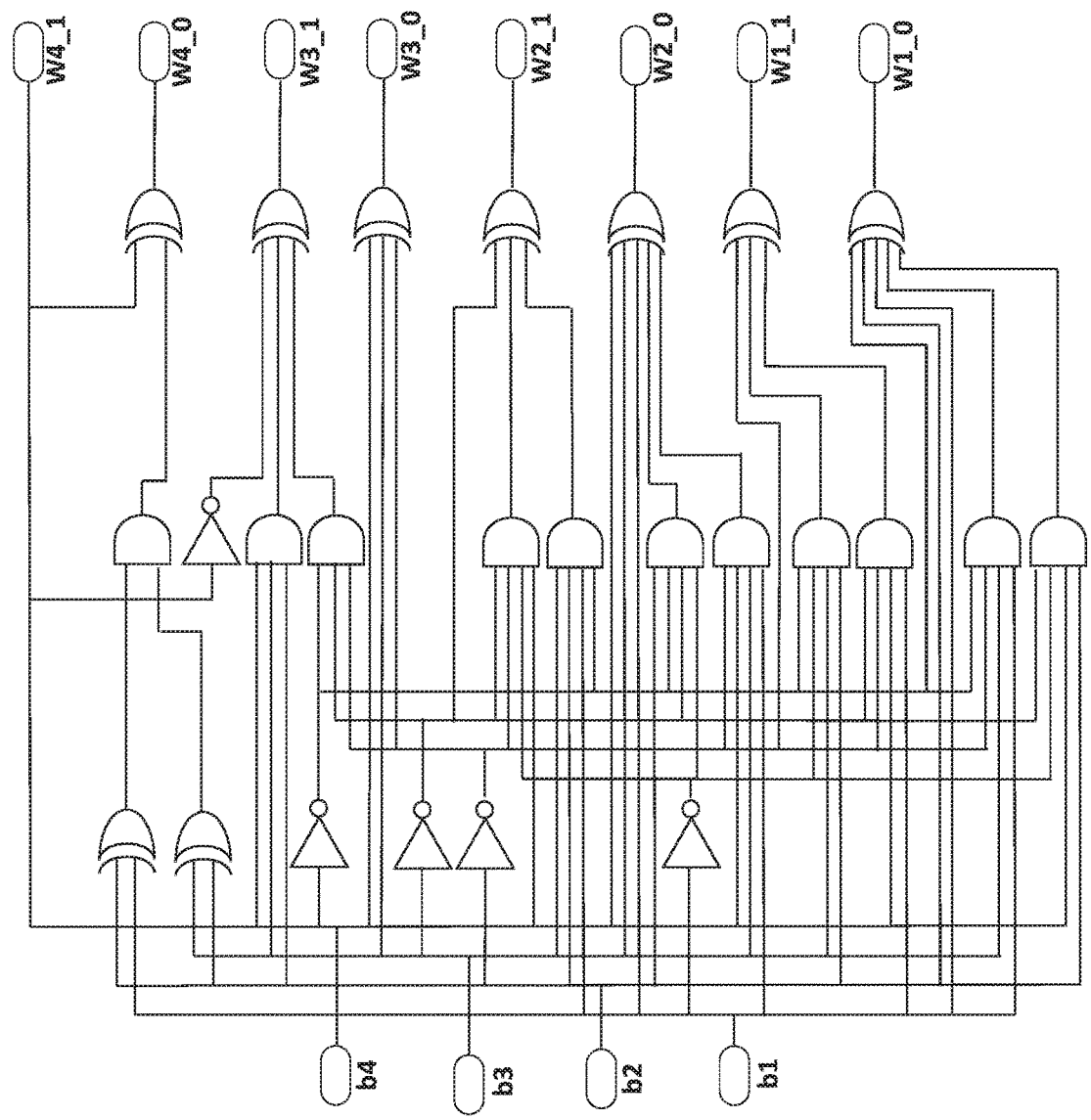
FIGS. 2A-2B are diagrams representing a two-stage implementation of the encoder 114 of FIG. 1 according to one possible embodiment for the 4b4w-PAM4 coding schemes of Tables 1 and 2.

Detailed illustrative embodiments of the present disclosure are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functions/acts involved.

FIG. 1 is a simplified block diagram of a hardware configuration 100 that supports chip-to-chip communication in which a first chip 110 has a transmitter 112 with an encoder 114 and a second chip 130 has a receiver 132 with a decoder 134, where the encoder 114 encodes digital data for the transmitter 112 to transmit as encoded analog signals via an M-wire parallel communication bus 120 to the receiver 132, where the decoder 134 decodes the encoded analog signals to recover the digital data and where M is an integer greater than one. Although not shown in FIG. 1, in some implementations, the second chip 130 has an analogous transmitter and the first chip 110 has an analogous receiver for transmitting analogous encoded analog signals from the second chip 130 to the first chip 110 via an analogous parallel communication bus.

According to certain embodiments of this disclosure, the encoder 114 employs an N-bit, M-wire PAM-Q coding scheme to encode the data for transmission as M voltage signals over the M-wire bus 120, where N and Q are also integers greater than one.

4-Bit, 4-Wire PAM4 Coding Scheme

Table 1 presents a generalized PAM coding scheme in which N=4 bits, M=4 wires, and the PAM coding scheme has Q=4 voltage levels $l_1$-$l_4$, where $l_1<l_2<l_3<l_4$. According to this 4-bit, 4-wire PAM4 coding scheme, the 4-bit value $(b_4\ b_3\ b_2\ b_1)$=(0 0 0 0) is encoded into four voltage signals $w_1$-$w_4$, where the voltage signal $w_1$ transmitted on a first wire of the 4-wire bus 120 has amplitude $l_4$, the voltage signal $w_2$ transmitted on a second wire of the bus 120 has amplitude $l_3$, the voltage signal $w_3$ transmitted on a third wire of the bus 120 has amplitude $l_2$, and the voltage signal $w_4$ transmitted on the fourth wire of the bus 120 has amplitude $l_1$, and analogously for the 15 other possible 4-bit combinations listed in Table 1. Note that, as presented in Table 1, each of the four 4-bit combinations (0 1 1 0), (0 1 1 1), (1 0 0 0), and (1 0 0 1) can be encoded three different ways.

TABLE 1

GENERALIZED 4-BIT, 4-WIRE PAM4 CODING SCHEME

| $(b_4\ b_3\ b_2\ b_1)$ | $(w_4\ w_3\ w_2\ w_1)$ |
|---|---|
| (0 0 0 0) | $(l_1\ l_2\ l_3\ l_4)$ |
| (0 0 0 1) | $(l_1\ l_2\ l_4\ l_3)$ |
| (0 0 1 0) | $(l_2\ l_3\ l_4\ l_1)$ |
| (0 0 1 1) | $(l_1\ l_3\ l_4\ l_2)$ |
| (0 1 0 0) | $(l_1\ l_3\ l_2\ l_4)$ |
| (0 1 0 1) | $(l_2\ l_3\ l_1\ l_4)$ |
| (0 1 1 0) | $(l_1\ l_4\ l_2\ l_3); (l_2\ l_4\ l_3\ l_1); (l_3\ l_4\ l_1\ l_2)$ |
| (0 1 1 1) | $(l_1\ l_4\ l_3\ l_2); (l_2\ l_4\ l_1\ l_3); (l_3\ l_4\ l_2\ l_1)$ |
| (1 0 0 0) | $(l_4\ l_1\ l_2\ l_3); (l_2\ l_1\ l_3\ l_4); (l_3\ l_1\ l_4\ l_2)$ |
| (1 0 0 1) | $(l_4\ l_1\ l_3\ l_2); (l_3\ l_1\ l_2\ l_4); (l_2\ l_1\ l_4\ l_3)$ |
| (1 0 1 0) | $(l_3\ l_2\ l_4\ l_1)$ |
| (1 0 1 1) | $(l_4\ l_2\ l_3\ l_1)$ |
| (1 1 0 0) | $(l_4\ l_2\ l_1\ l_3)$ |
| (1 1 0 1) | $(l_3\ l_2\ l_1\ l_4)$ |
| (1 1 1 0) | $(l_4\ l_3\ l_1\ l_2)$ |
| (1 1 1 1) | $(l_4\ l_3\ l_2\ l_1)$ |

In one possible specific implementation of the coding scheme of Table 1, the voltage level $l_1$ is 0 volts, the voltage level $l_2$ is a specified non-zero voltage level, the voltage level $l_3$ is twice as high as the voltage level $l_2$, and the voltage level $l_4$ is three times as high as the voltage level $l_2$. In that case, the coding scheme of Table 1 can be represented as shown in Table 2, where "0" represents the zero voltage level $l_1$, "1" represents the non-zero voltage level $l_2$, "2" represents the non-zero voltage level $l_3$, and "3" represents the non-zero voltage level $l_4$. Note that the average transmit power for the coding scheme of Table 2 is (0+1+4+9)/4 or 3.5 power units per bit, where power is proportional to voltage squared. Those skilled in the art will understand that, in alternative implementations, values other than 0-3 can be used for the voltage levels $l_1$-$l_4$, as long as they satisfy the condition that $l_1<l_2<l_3<l_4$.

TABLE 2

SPECIFIC 4-BIT, 4-WIRE PAM4 CODING SCHEME

| $(b_4\ b_3\ b_2\ b_1)$ | $(w_4\ w_3\ w_2\ w_1)$ |
|---|---|
| (0 0 0 0) | (0 1 2 3) |
| (0 0 0 1) | (0 1 3 2) |
| (0 0 1 0) | (1 2 3 0) |
| (0 0 1 1) | (0 2 3 1) |
| (0 1 0 0) | (0 2 1 3) |
| (0 1 0 1) | (1 2 0 3) |
| (0 1 1 0) | (0 3 1 2); (1 3 2 0); (2 3 0 1) |
| (0 1 1 1) | (0 3 2 1); (1 3 0 2); (2 3 1 0) |
| (1 0 0 0) | (3 0 1 2); (1 0 2 3); (2 0 3 1) |
| (1 0 0 1) | (3 0 2 1); (2 0 1 3); (1 0 3 2) |
| (1 0 1 0) | (2 1 3 0) |
| (1 0 1 1) | (3 1 2 0) |
| (1 1 0 0) | (3 1 0 2) |
| (1 1 0 1) | (2 1 0 3) |
| (1 1 1 0) | (3 2 0 1) |
| (1 1 1 1) | (3 2 1 0) |

Note that, in the generalized coding scheme of Table 1, all sixteen different 4-bit values $(b_4\ b_3\ b_2\ b_1)$ are encoded using permutations of the same set of four voltage signals, where each permutation has exactly one voltage signal with voltage level $l_1$, exactly one voltage signal with voltage level $l_2$, exactly one voltage signal with voltage level $l_3$, and exactly one voltage signal with voltage level $l_4$. Similarly, in the specific coding scheme of Table 2, all sixteen different 4-bit values $(b_4\ b_3\ b_2\ b_1)$ are encoded using permutations of the same set of four voltage signals, where each permutation has exactly one voltage signal with voltage level 0, exactly one voltage signal with voltage level 1, exactly one voltage signal with voltage level 2, and exactly one voltage signal with voltage level 3.

Figure 2B:
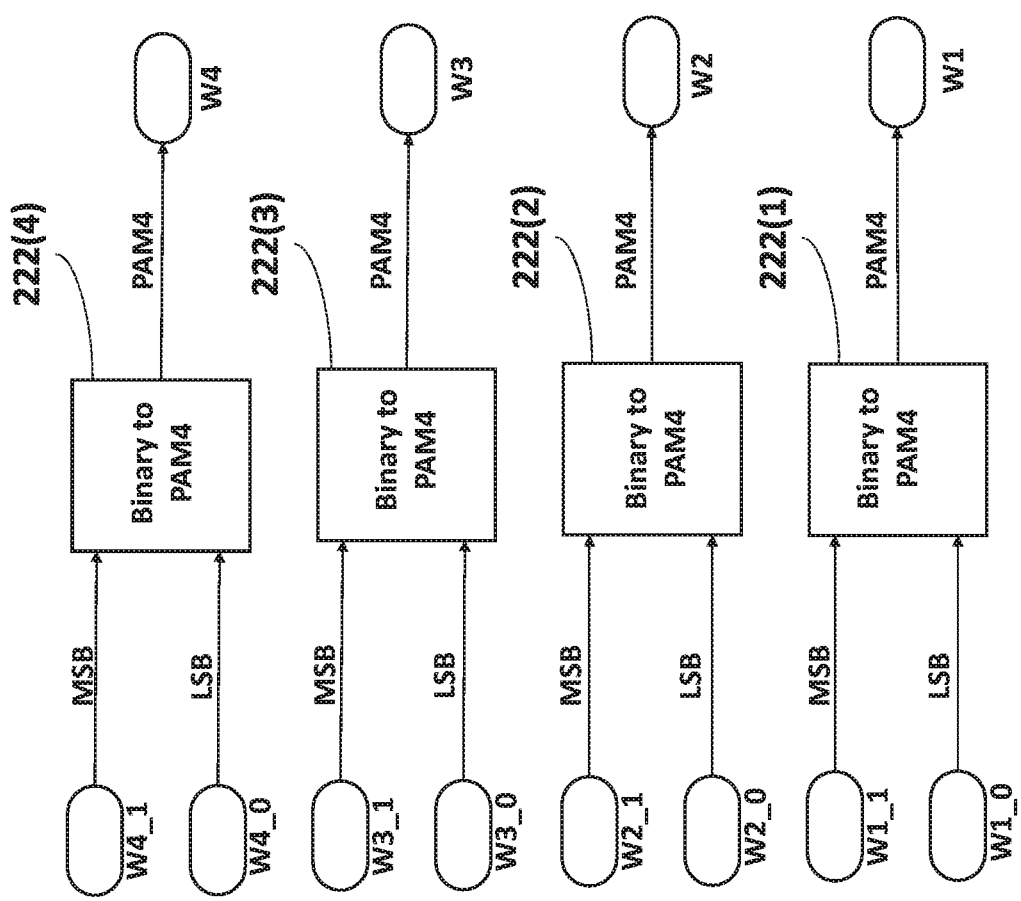

FIGS. 2A-2B are diagrams representing a two-stage implementation of the encoder 114 of FIG. 1 according to one possible embodiment for the 4b4w-PAM4 coding schemes of Tables 1 and 2, where FIG. 2A is a schematic circuit diagram of a first, binary coding stage 210 and FIG. 2B is a schematic block diagram of a second, binary-to-PAM4 coding stage 220. The binary coding stage 210 of FIG. 2A converts the four-bit value $(b_4\ b_3\ b_2\ b_1)$ into four two-bit binary values (wi_1, wi_0), where i=1-4. The binary-to-PAM4 coding stage 220 of FIG. 2B has four binary-to-PAM4 blocks 222(1)-222(4), each of which converts a corresponding two-bit binary value (wi_1, wi_0) into a different one of the four PAM4 voltage signals $w_1$-$w_4$.

Figure 2C:
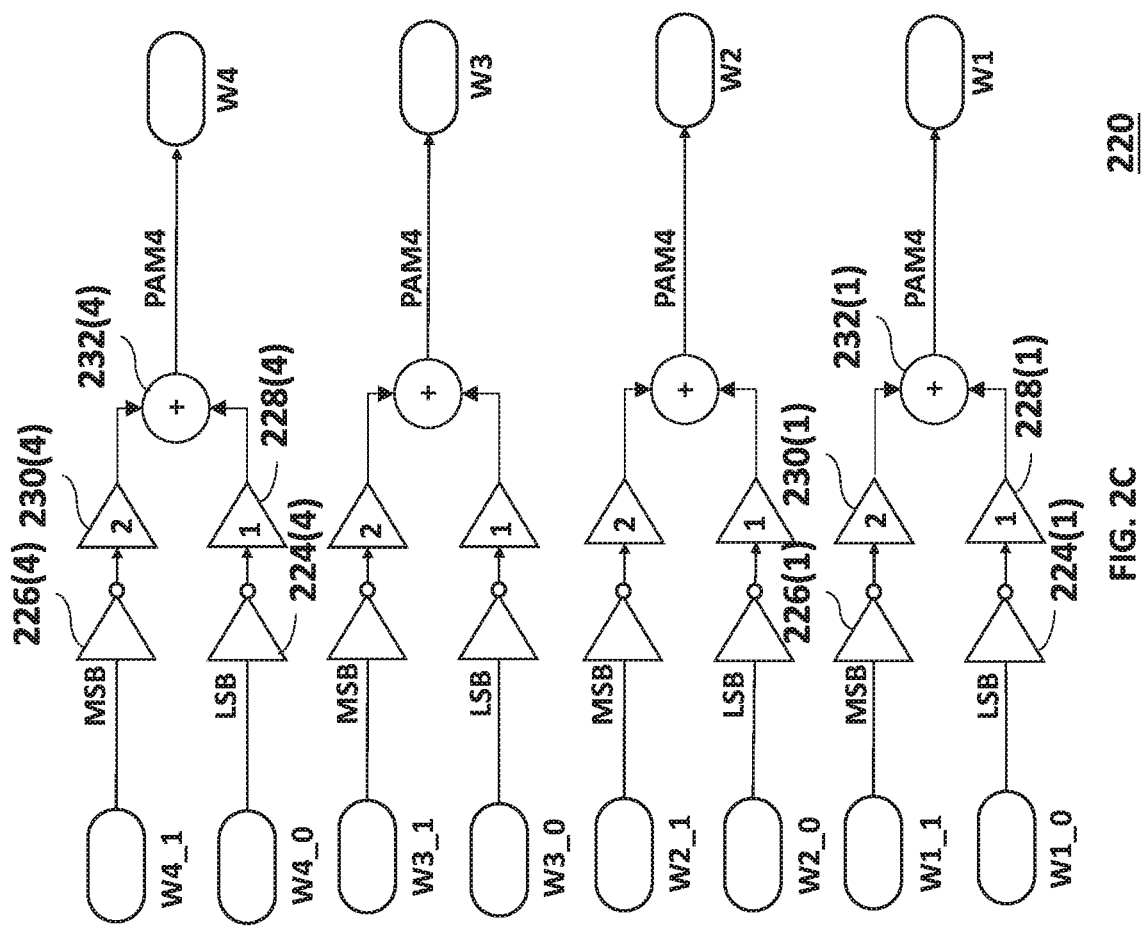
FIG. 2C is a schematic block diagram of the binary-to-PAM4 coding stage 220 of FIG. 2B for an implementation.

FIG. 2C is a schematic block diagram of the binary-to-PAM4 coding stage 220 of FIG. 2B for an implementation in which each binary-to-PAM4 coder 222(i) of FIG. 2B is implemented as a 2-bit digital-to-analog converter. Inverters 224(i) and 226(i) are used between the respective inputs wi_0 and wi_1 and the respective weighted limiting amplifiers 228(i) and 230(i). A weight of 1 is assigned to the inverted LSB wi_0 of the corresponding two-bit binary value (wi_0, wi_1) using the limiting amplifier 228(i), a weight of 2 is assigned to the inverted MSB wi_1 of the corresponding two-bit binary value (wi_0, wi_1) using the limiting amplifier 230(i), and a summation 232(i) is performed on the resulting weighted values to generate the signal Wi.

Figure 2D:
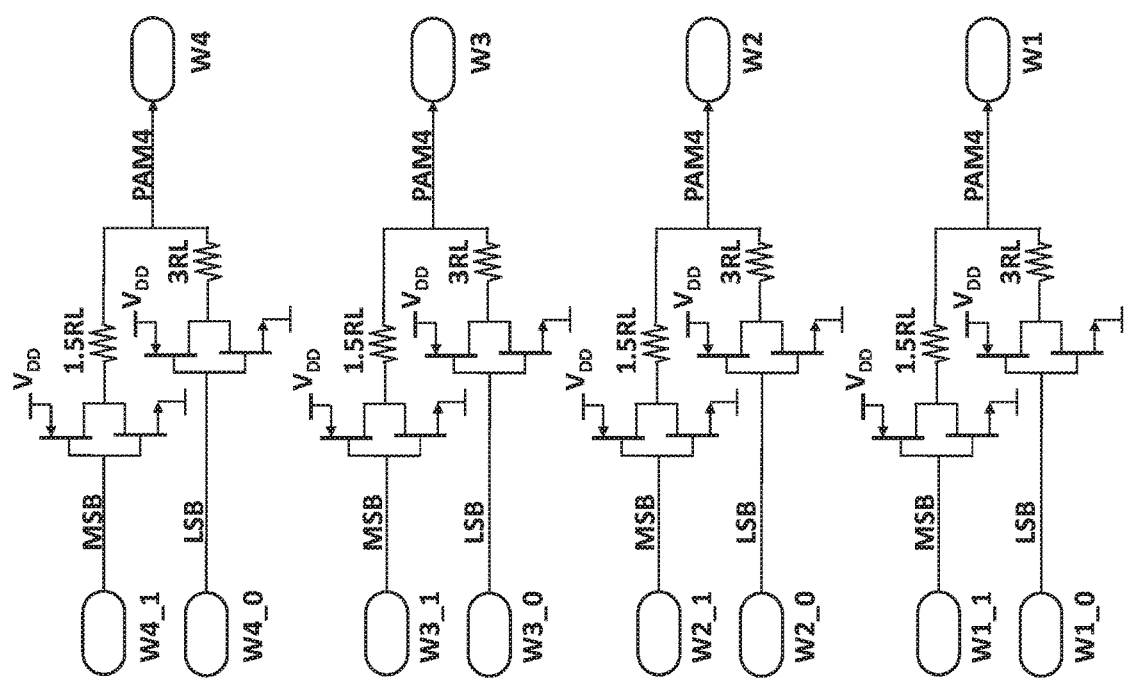
FIG. 2D is a schematic circuit diagram of one possible implementation of the binary-to-PAM4 coding stage 220 of FIG. 2C.

FIG. 2D is a schematic circuit diagram of one possible implementation of the binary-to-PAM4 coding stage 220 of FIG. 2C in which each combination of an inverter 224(i) and 226(i) and a respective limiting amplifier 228(i) and 230(i) of FIG. 2C is implemented with an inverter and a corresponding resistor.

In order to decode the PAM4 voltage signals $w_1$-$w_4$ encoded using any specific implementation of the generalized coding scheme of Table 1, of which the coding scheme of Table 2 is one specific example, to recover the original 4-bit value ($b_4\ b_3\ b_2\ b_1$), the decoder 134 of FIG. 1 can be designed to implement four of the following decoding equations:

$$b_4 = 1(w_4 > w_3) \quad (1)$$

$$b_3 = 1(w_3 > w_2) \quad (2)$$

$$b_2 = 1(w_3 > w_1) \quad (3)$$

$$b_1 = 1(w_2 > w_1) + 1(w_4 > w_2) - 1(w_4 > w_1) \quad (4a)$$

$$b_1 = 1(w_2 > w_1) \text{ XOR } 1(w_4 > w_2) \text{ XOR } 1(w_4 > w_1) \quad (4b)$$

In particular, according to Equation (1), the fourth bit $b_4$ is 1 if the voltage $w_4$ is greater than the voltage $w_3$; otherwise, $b_4$ is 0. Similarly, according to Equation (2), the third bit $b_3$ is 1 if the voltage $w_3$ is greater than the voltage $w_2$; otherwise, $b_3$ is 0, and, according to Equation (3), the second bit $b_2$ is 1 if the voltage $w_3$ is greater than the voltage $w_1$; otherwise, $b_2$ is 0.

As represented above, there are two different ways to recover the first bit b1. According to Equation (4a), the first way employs three comparisons followed by two computations. In particular, if $w_2$ is greater than $w_1$, then the first term of the addition of Equation (4a) is 1; otherwise, the first term is 0. Similarly, if $w_4$ is greater than $w_2$, then the second term of the addition of Equation (4a) is 1; otherwise, the second term is 0. Lastly, if $w_4$ is greater than $w_1$, then the second term of the subtraction of Equation (4a) is 1; otherwise, the second term is 0.

According to Equation (4b), the second way of recovering the first bit b1 employs three comparisons followed by two logic operations. In particular, if $w_2$ is greater than $w_1$, then the first term of the first XOR operation of Equation (4b) is 1; otherwise, the first term is 0. Similarly, if $w_4$ is greater than $w_2$, then the second term of the first XOR operation of Equation (4b) is 1; otherwise, the second term is 0. Lastly, if $w_4$ is greater than $w_1$, then the second term of the second XOR operation of Equation (4b) is 1; otherwise, the second term is 0.

Figure 3A:
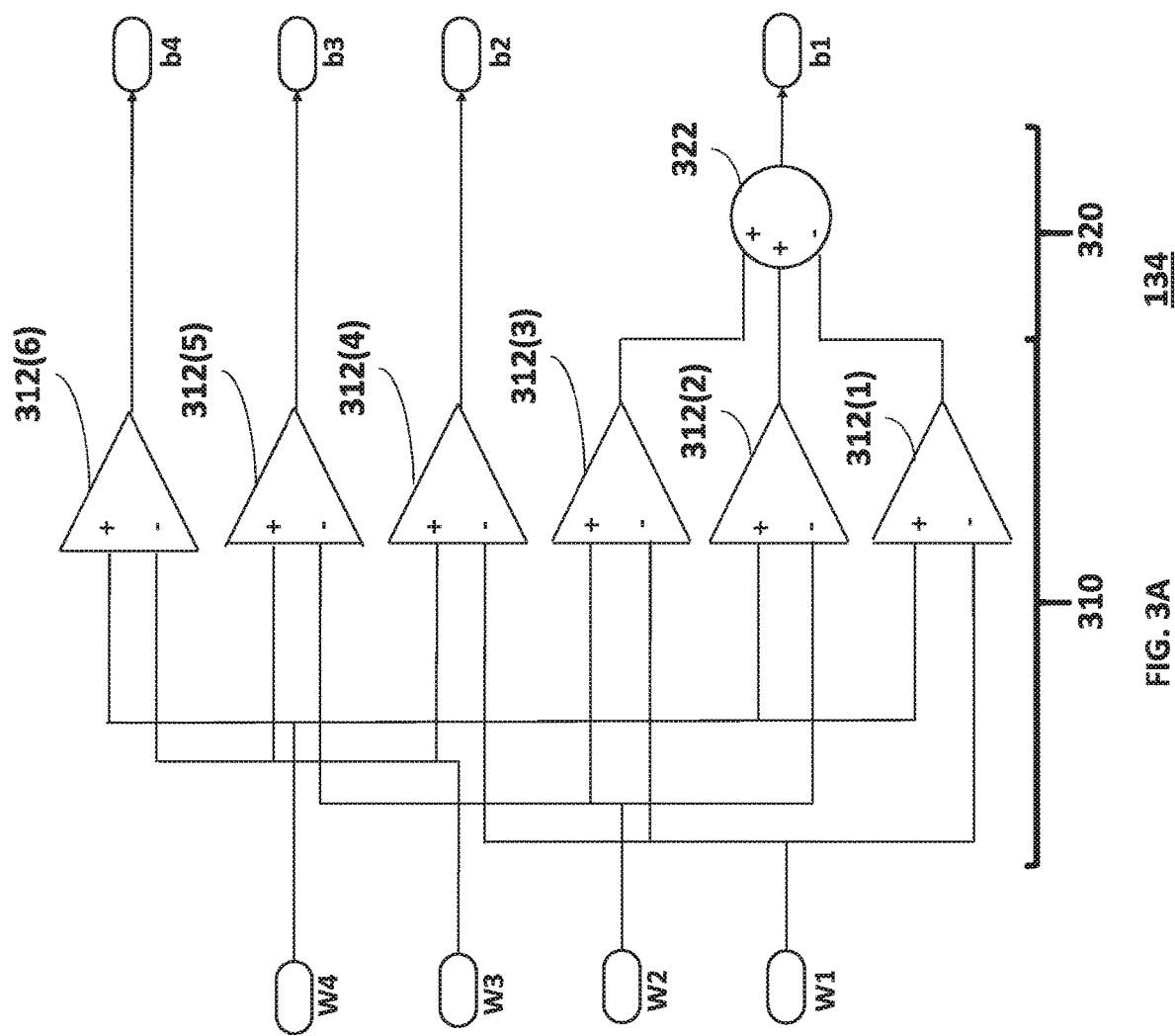
FIG. 3A is a schematic circuit diagram of the decoder 134 of FIG. 1 that implements Equations (1)-(3) and (4a), according to one possible implementation.

FIG. 3A is a schematic circuit diagram of the decoder 134 of FIG. 1 that implements Equations (1)-(3) and (4a), according to one possible implementation. In this implementation, the decoder 134 has two decoding stages: a comparator stage 310 followed by a computation stage 320. The comparator stage CAA has six comparators 312(1)-312(6) that receive the four PAM4 voltage signals $w_1$-$w_4$ and perform the six comparisons of Equations (1)-(3) and (4a), while the computation stage 320 has a summation node 322 that performs the addition and subtraction of Equation (4a). The output of the decoder 134 of FIG. 3A is the recovered 4-bit value ($b_4\ b_3\ b_2\ b_1$).

Figure 3B:
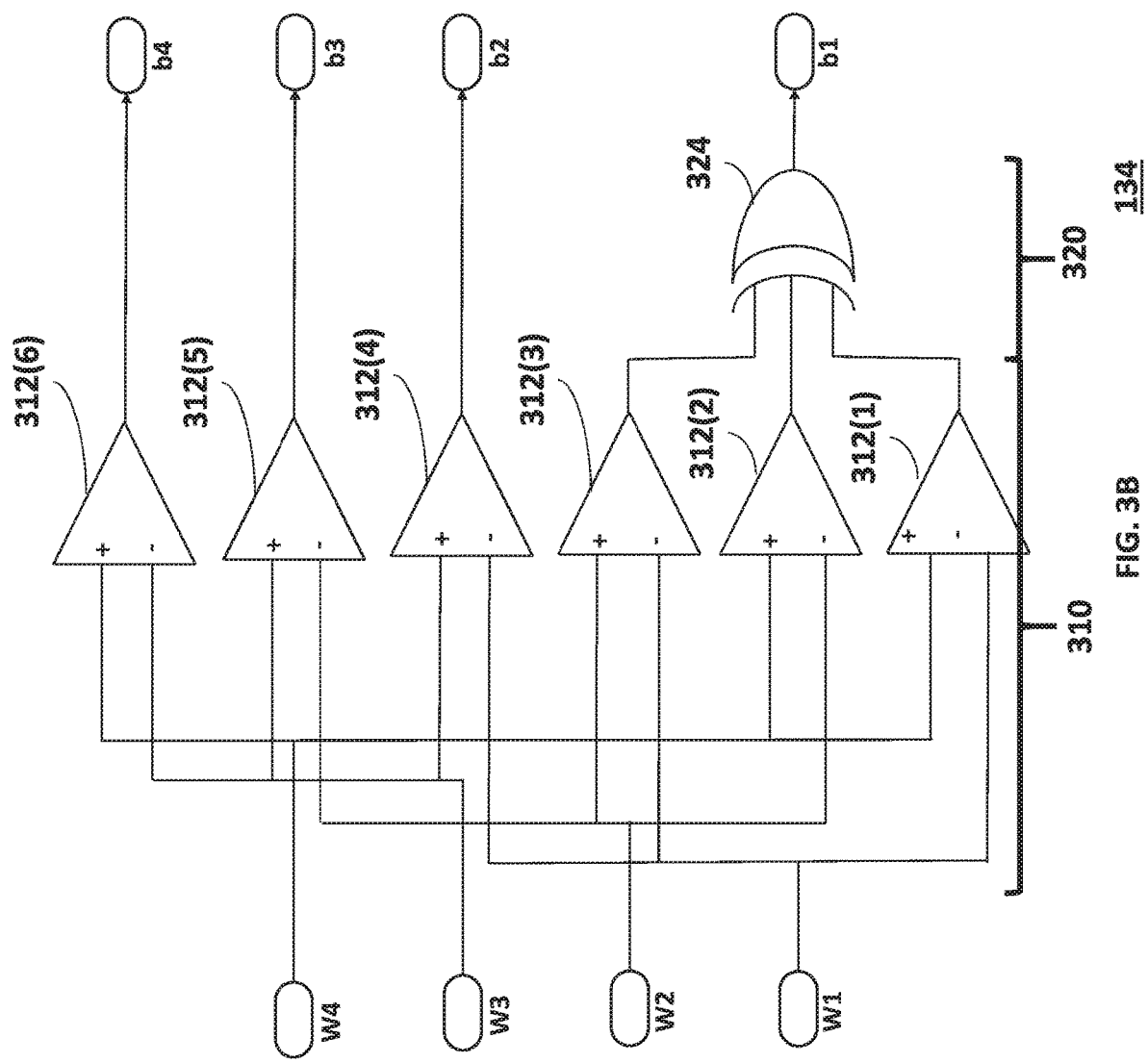
FIG. 3B is a schematic circuit diagram of the decoder 134 of FIG. 1 that implements Equations (1)-(3) and (4b), according to one possible implementation.

FIG. 3B is a schematic circuit diagram of the decoder 134 of FIG. 1 that implements Equations (1)-(3) and (4b), according to one possible implementation. In this implementation, the decoder 134 has two decoding stages: a comparator stage 310 followed by a logic stage 320. The comparator stage 310 is identical to the comparator stage 310 of FIG. 3A, while the logic stage 320 has an XOR gate 324 that performs the XOR logic operations of Equation (4b). Here, too, the output of the decoder 134 of FIG. 3B is the recovered 4-bit value ($b_4\ b_3\ b_2\ b_1$).

4-Bit, 5-Wire PAM3 Coding Scheme

Table 3 presents a generalized PAM coding scheme in which N=4 bits, M=5 wires, and the PAM coding scheme has Q=3 voltage levels $l_1$-$l_3$, where $l_1 < l_2 < l_3$. Note that the differences between different pairs of consecutive voltage levels do not need to be equal. This degree of freedom can be taken advantage of in order to improve the vertical eye opening at the receiver. According to this 4-bit, 5-wire PAM3 coding scheme, each 4-bit value ($b_4\ b_3\ b_2\ b_1$) is encoded into five analog voltage signals $w_1$-$w_5$ for transmission over the M=5 wires of the 5-wire parallel bus 120 of FIG. 1.

TABLE 3

GENERALIZED 4-BIT, 5-WIRE PAM3 CODING SCHEME

| ($b_4\ b_3\ b_2\ b_1$) | ($w_5\ w_4\ w_3\ w_2\ w_1$) |
|---|---|
| (0 0 0 0) | ($l_1\ l_3\ l_1\ l_2\ l_2$) |
| (0 0 0 1) | ($l_1\ l_2\ l_1\ l_2\ l_3$) |
| (0 0 1 0) | ($l_1\ l_3\ l_2\ l_1\ l_2$) |
| (0 0 1 1) | ($l_1\ l_2\ l_2\ l_1\ l_3$) |
| (0 1 0 0) | ($l_2\ l_3\ l_1\ l_2\ l_1$) |
| (0 1 0 1) | ($l_1\ l_2\ l_2\ l_3\ l_1$) |
| (0 1 1 0) | ($l_2\ l_3\ l_2\ l_1\ l_1$) |
| (0 1 1 1) | ($l_1\ l_2\ l_3\ l_2\ l_1$) |
| (1 0 0 0) | ($l_3\ l_1\ l_1\ l_2\ l_2$) |
| (1 0 0 1) | ($l_2\ l_1\ l_1\ l_2\ l_3$) |
| (1 0 1 0) | ($l_3\ l_1\ l_2\ l_1\ l_2$) |
| (1 0 11) | ($l_2\ l_1\ l_2\ l_1\ l_3$) |
| (1 1 0 0) | ($l_3\ l_2\ l_1\ l_2\ l_1$) |
| (1 1 0 1) | ($l_2\ l_1\ l_2\ l_3\ l_1$) |
| (1 1 1 0) | ($l_3\ l_2\ l_2\ l_1\ l_1$) |
| (1 1 1 1) | ($l_2\ l_1\ l_3\ l_2\ l_1$) |

In one possible specific implementation of the coding scheme of Table 3, the voltage level $l_1$ is 0 volts, the voltage level $l_2$ is a specified non-zero voltage level, and the voltage level $l_3$ is twice as high as the voltage level $l_2$. In that case, the coding scheme of Table 3 can be represented as shown in Table 4, where "0" represents the zero voltage level $l_1$, "1" represents the non-zero voltage level $l_2$, and "2" represents the non-zero voltage level $l_3$. Note that the average transmit power for the coding scheme of Table 4 is (0+0+1+1+4)/5 or 1.2 power units per bit. Those skilled in the art will understand that, in alternative implementations, values other than 0-2 can be used for the voltage levels $l_1$-$l_3$, as long as they satisfy the condition that $l_1 < l_2 < l_3$.

TABLE 4

SPECIFIC 4-BIT, 5-WIRE PAM3 CODING SCHEME

| ($b_4\ b_3\ b_2\ b_1$) | ($w_5\ w_4\ w_3\ w_2\ w_1$) |
|---|---|
| (0 0 0 0) | (0 2 0 1 1) |
| (0 0 0 1) | (0 1 0 1 2) |
| (0 0 1 0) | (0 2 1 0 1) |
| (0 0 1 1) | (0 1 1 0 2) |
| (0 1 0 0) | (1 2 0 1 0) |
| (0 1 0 1) | (0 1 1 2 0) |
| (0 1 1 0) | (1 2 1 0 0) |
| (0 1 1 1) | (0 1 2 1 0) |
| (1 0 0 0) | (2 0 0 1 1) |
| (1 0 0 1) | (1 0 0 1 2) |
| (1 0 1 0) | (2 0 1 0 1) |
| (1 0 1 1) | (1 0 1 0 2) |
| (1 1 0 0) | (2 1 0 1 0) |
| (1 1 0 1) | (1 0 1 2 0) |
| (1 1 1 0) | (2 1 1 0 0) |
| (1 1 1 1) | (1 0 2 1 0) |

Note that, in the generalized coding scheme of Table 3, all sixteen different 4-bit values ($b_4\ b_3\ b_2\ b_1$) are encoded using permutations of the same set of five voltage signals, where each permutation has exactly two voltage signals with voltage level $l_1$, exactly two voltage signals with voltage level $l_2$, and exactly one voltage signal with voltage level $l_3$.

Similarly, in the specific coding scheme of Table 4, all sixteen different 4-bit values ($b_4\,b_3\,b_2\,b_1$) are encoded using permutations of the same set of five voltage signals, where each permutation has exactly two voltage signals with voltage level 0, exactly two voltage signals with voltage level 1, and exactly one voltage signal with voltage level 2.

Figure 4A:
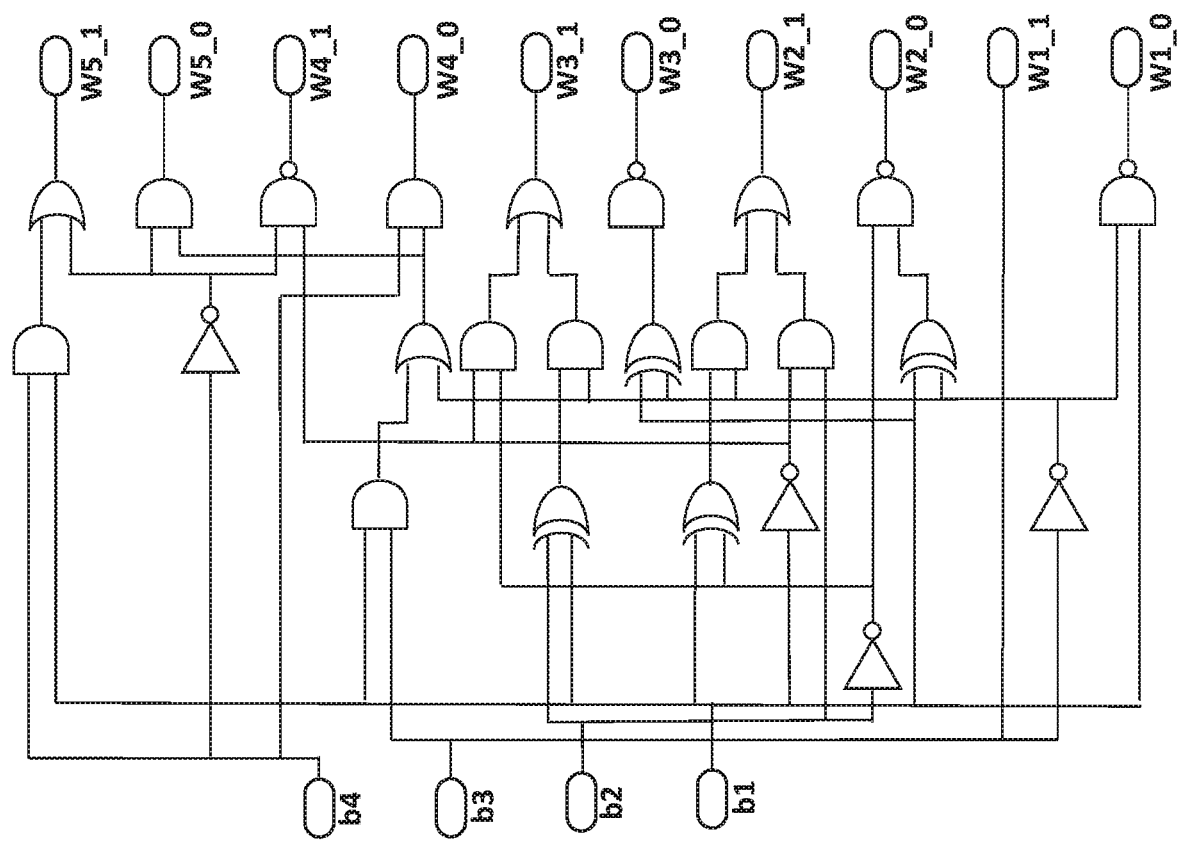
FIGS. 4A-4B are diagrams representing a two-stage implementation of the encoder 114 of FIG. 1 according to one possible embodiment for the 4b5w-PAM4 coding schemes of Tables 3 and 4.
Figure 4B:
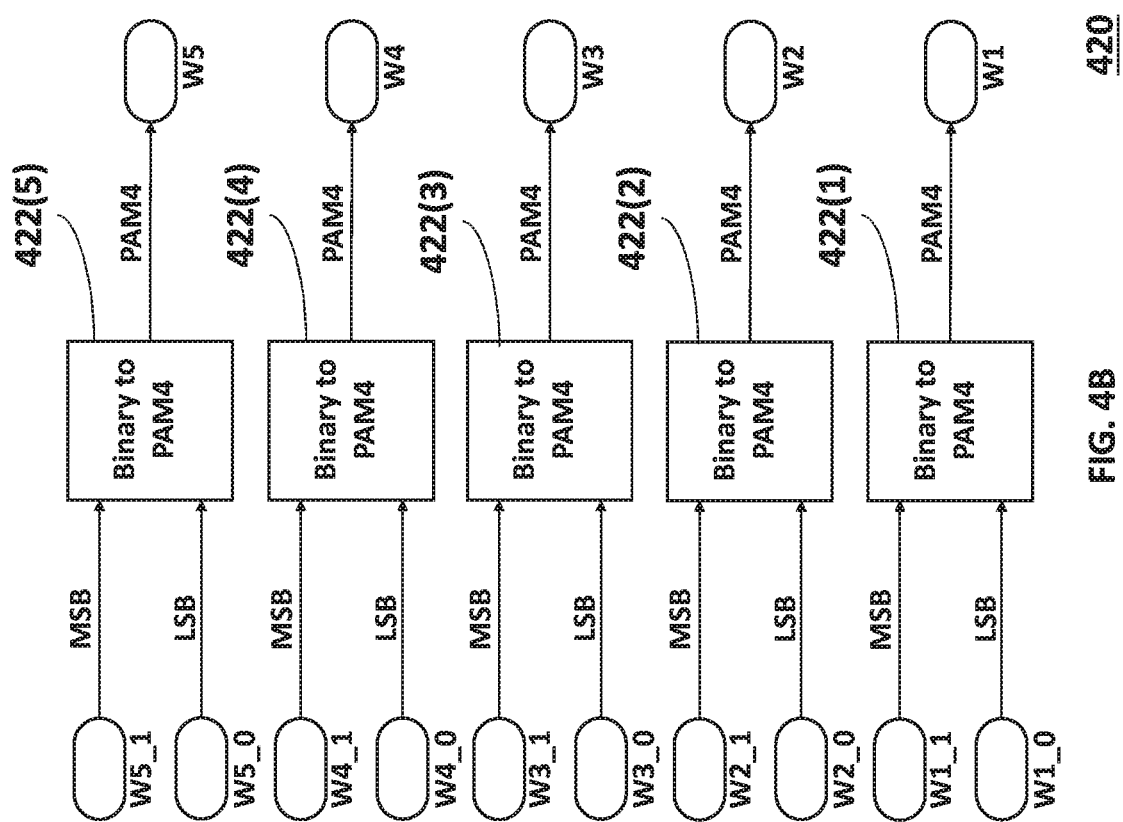

FIGS. 4A-4B are diagrams representing a two-stage implementation of the encoder 114 of FIG. 1 according to one possible embodiment for the 4b5w-PAM4 coding schemes of Tables 3 and 4, where FIG. 4A is a schematic circuit diagram of a first, binary coding stage 410 and FIG. 4B is a schematic block diagram of a second, binary-to-PAM4 coding stage 420. The binary coding stage 410 of FIG. 4A converts the four-bit value ($b_4\,b_3\,b_2\,b_1$) into five two-bit binary values (wi_1, wi_0), where i=1-5. The binary-to-PAM4 coding stage 420 of FIG. 4B has five binary-to-PAM4 coder 422(1)-422(5), each of which converts a corresponding two-bit binary value (wi_1, wi_0) into a different one of the five PAM4 voltage signals $w_1$-$w_5$.

Figure 4C:
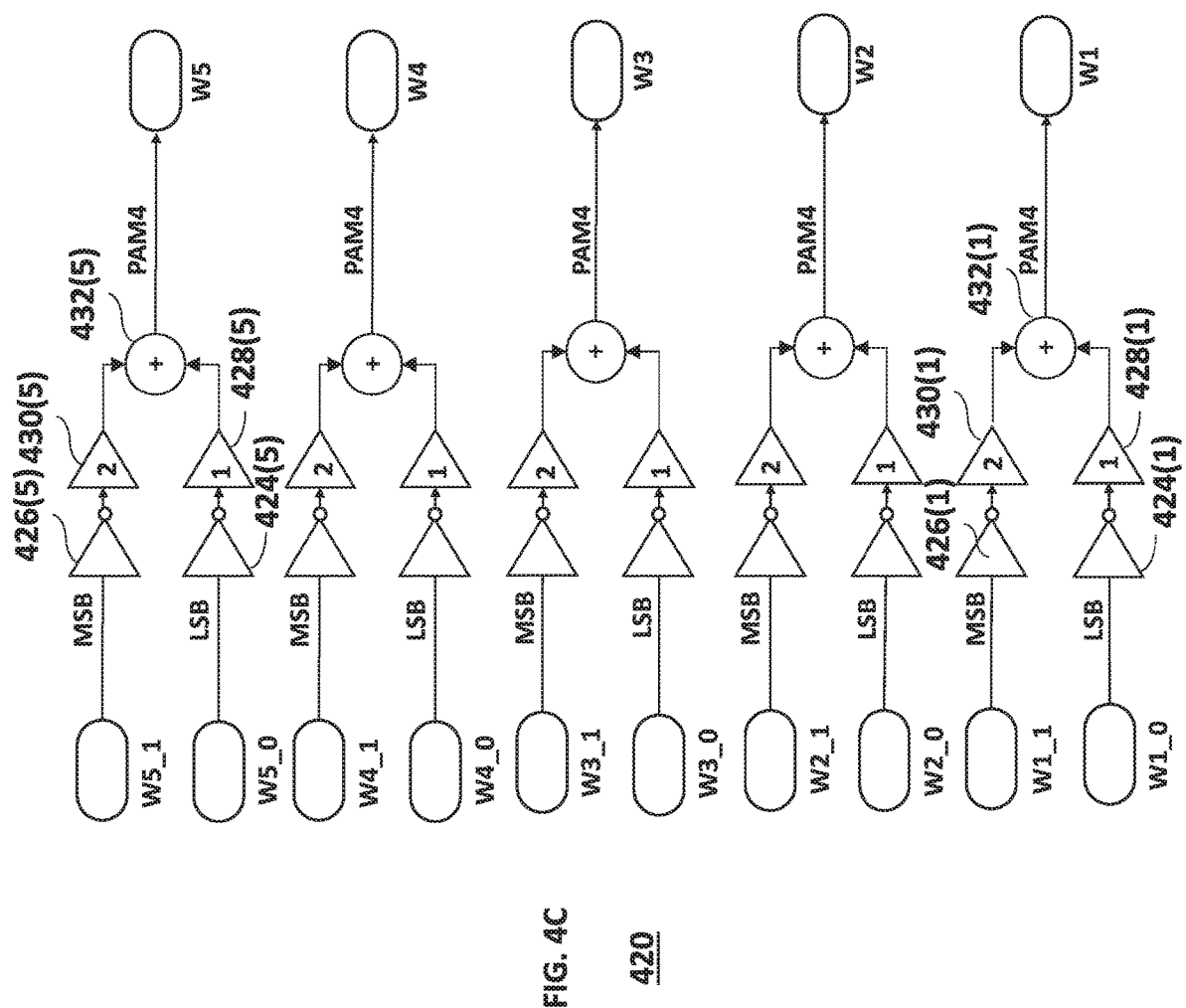
FIG. 4C is a schematic block diagram of the binary-to-PAM4 coding stage 420 of FIG. 4B for an implementation.

FIG. 4C is a schematic block diagram of the binary-to-PAM4 coding stage 420 of FIG. 4B for an implementation in which each binary-to-PAM4 coder 422(i) of FIG. 4B is implemented as a 2-bit digital-to-analog converter. Inverters 424(i) and 426(i) are used between the respective inputs wi_0 and wi_1 and the respective weighted limiting amplifiers 428(i) and 430(i). A weight of 1 is assigned to the inverted LSB wi_0 of the corresponding two-bit binary value (wi_0, wi_1) using the limiting amplifier 428(i), a weight of 2 is assigned to the inverted MSB wi_1 of the corresponding two-bit binary value (wi_0, wi_1) using the limiting amplifier 430(i), and a summation 432(i) is performed on the resulting weighted values to generate the signal Wi.

Figure 4D:
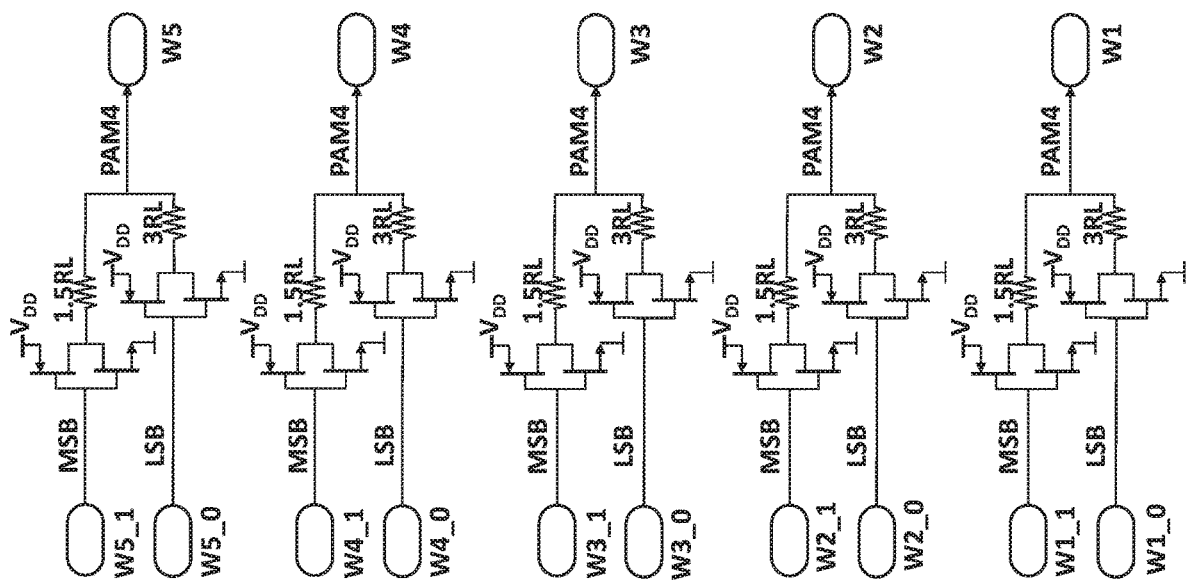
FIG. 4D is a schematic circuit diagram of one possible implementation of the binary-to-PAM4 coding stage 420 of FIG. 4C.

FIG. 4D is a schematic circuit diagram of one possible implementation of the binary-to-PAM4 coding stage 420 of FIG. 4C in which each combination of an inverter 424(i) and 426(i) and a respective amplifier 428(i) and 430(i) of FIG. 4C is implemented with an inverter and a corresponding resistor.

In order to decode the PAM3 voltage signals $w_1$-$w_5$ encoded using any specific implementation of the generalized coding scheme of Table 3, of which the coding scheme of Table 4 is one specific example, to recover the original 4-bit value ($b_4\,b_3\,b_2\,b_1$), the decoder 134 of FIG. 1 can be designed to implement the following decoding equations:

$$b_4 = 1(w_5 > w_4) \qquad (5)$$

$$b_3 = 1((w_3+w_2)/2 > w_1) \qquad (6)$$

$$b_2 = 1(w_3 > w_2) \qquad (7)$$

$$b_1 = 1((w_1+w_2+w_3)/3 > (w_4+w_5)/2) \qquad (8)$$

Figure 5A:
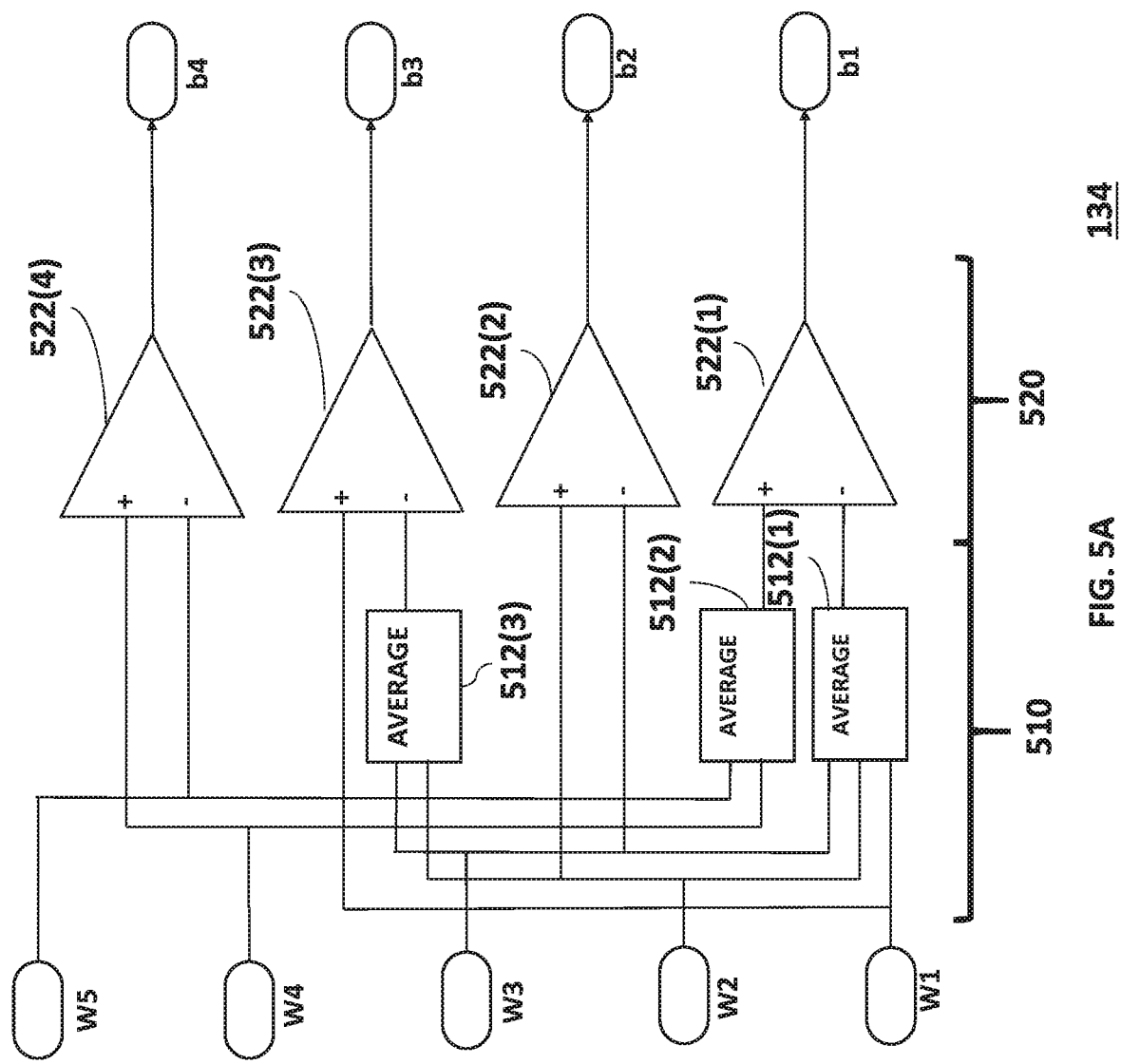
FIG. 5A is a schematic circuit diagram of the decoder 134 of FIG. 1 that implements Equations (5)-(8), according to one possible implementation.

FIG. 5A is a schematic circuit diagram of the decoder 134 of FIG. 1 that implements Equations (5)-(8), according to one possible implementation. In this implementation, the decoder 134 has two decoding stages: a computation stage 510 followed by a comparator stage 520. The computation stage 510 has three averaging blocks 512(1)-512(3) that receive the five PAM3 voltage signals $w_1$-$w_5$ and perform the averaging operations of Equations (6) and (8), while the comparison stage FB has four comparators 522(1)-522(4) that perform the four comparisons of Equations (5)-(8). The output of the decoder 134 of FIG. 5A is the recovered 4-bit value ($b_4\,b_3\,b_2\,b_1$).

FIG. 5B is a schematic circuit diagram of the decoder 134 of FIG. 5A, where each averaging block 512(i) is implemented with a corresponding summation node 514(i) and a corresponding divider 516(i). The comparator stage 520 of FIG. 5B is identical to the comparator stage 520 of FIG. 5A.

Figure 5C:
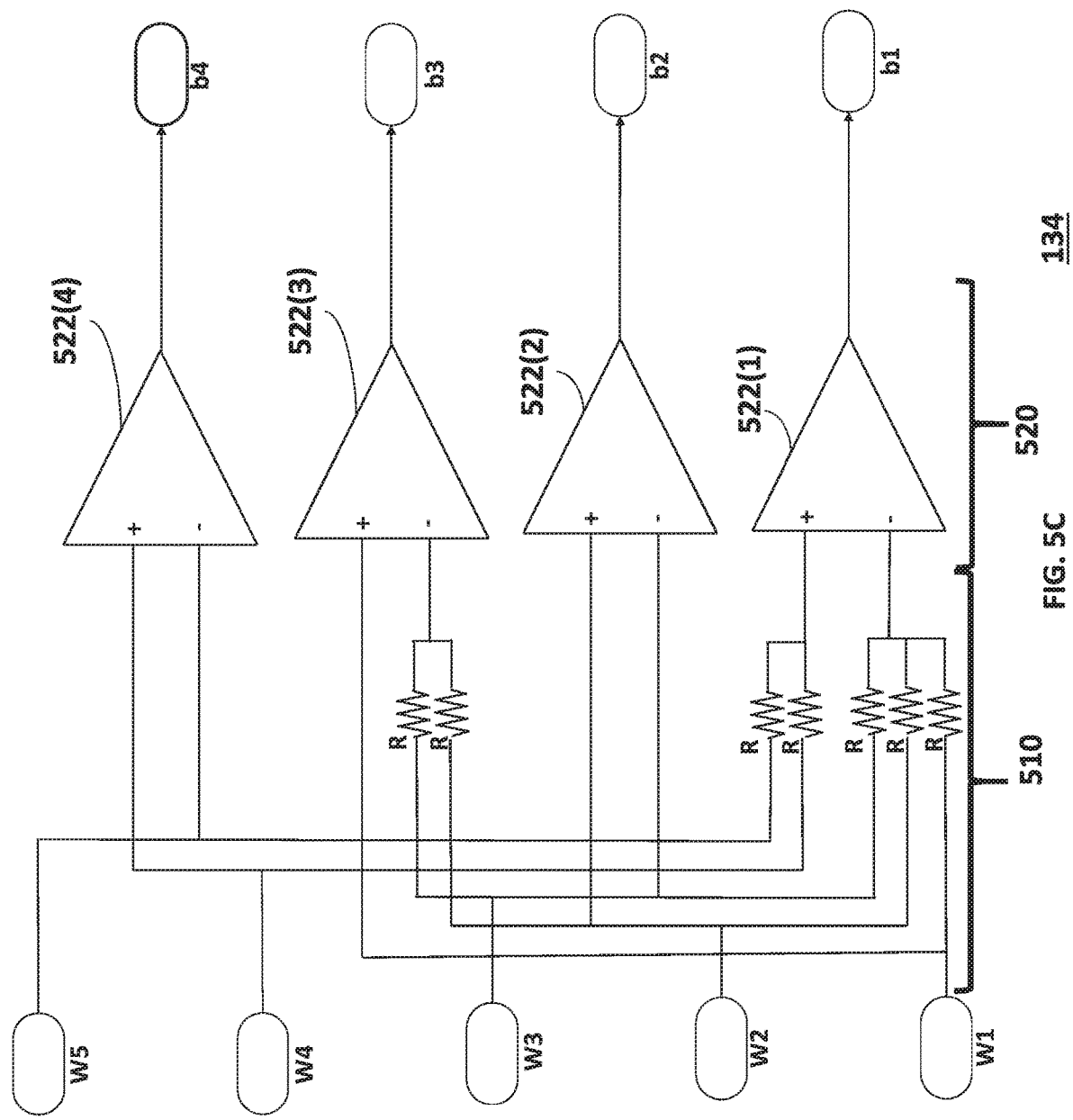
FIG. 5C is a schematic circuit diagram of the decoder 134 of FIG. 5A according to an implementation.

FIG. 5C is a schematic circuit diagram of the decoder 134 of FIG. 5A, where each averaging block 512(i) is implemented with a corresponding set of resistors. The comparator stage 520 of FIG. 5C is identical to the comparator stage 520 of FIG. 5A.

Figure 5D:
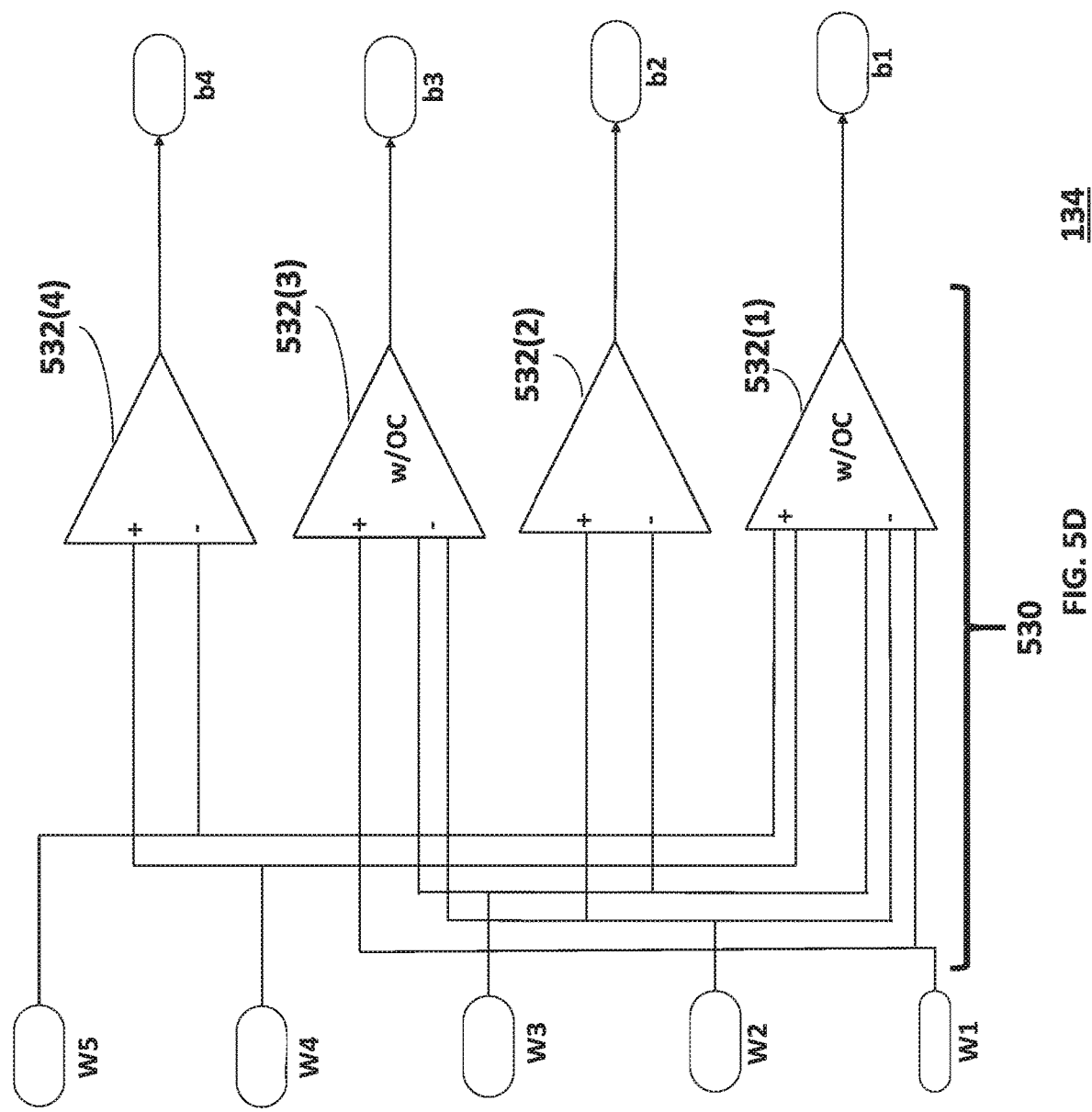
FIG. 5D is a schematic circuit diagram of the decoder 134 of FIG. 1 that implements Equations (5)-(8), according to another possible implementation.

FIG. 5D is a schematic circuit diagram of the decoder 134 of FIG. 1 that implements Equations (5)-(8), according to another possible implementation. In this implementation, the decoder 134 has only comparator stage 530 having four comparators 532(1)-532(4) that perform the four comparisons of Equations (5)-(8). The comparators 532(1) and 532(3) are designed to receive more than two inputs, where subsets of incoming signals are grouped and averaged within the comparator. In particular, the inputs $w_2$ and $w_3$ are averaged within the comparator 532(1) to form the negative input. Similarly, the inputs $w_1$, $w_2$, and $w_3$ are averaged within the comparator 532(3) to form the negative input, and the inputs $w_4$ and $w_5$ are averaged within the comparator 532(3) to form the positive input. Depending on the circuit implementation, comparators with more than two inputs may generate an offset which must be accounted for. As such, comparators 532(1) and 532(3) have appropriate offset compensation to perform the averaging of Equations (6) and (8). The output of the decoder 134 of FIG. 5D is the recovered 4-bit value ($b_4\,b_3\,b_2\,b_1$).

4-Bit, 5-Wire PAM4 Coding Scheme

Table 5 presents a generalized PAM coding scheme in which N=4 bits, M=5 wires, and the PAM coding scheme has Q=4 voltage levels $l_1$-$l_4$, where $l_1 < l_2 < l_3 < l_4$. Note that, here, too, the differences between consecutive voltage levels do not need to be constant, and it can even be taken advantage of in order to improve the vertical eye opening at the receiver. Note that the differences between different pairs of consecutive voltage levels do not need to be equal. This degree of freedom can be taken advantage of in order to improve the vertical eye opening at the receiver. According to this 4-bit, 5-wire PAM4 coding scheme, each 4-bit value ($b_4\,b_3\,b_2\,b_1$) is encoded into five analog voltage signals $w_1$-$w_5$ for transmission over the M=5 wires of the 5-wire parallel bus 120 of FIG. 1.

TABLE 5

GENERALIZED 4-BIT, 5-WIRE PAM4 CODING SCHEME

| ($b_4\,b_3\,b_2\,b_1$) | ($w_5\,w_4\,w_3\,w_2\,w_1$) |
|---|---|
| (0 0 0 0) | ($l_1\,l_4\,l_1\,l_2\,l_3$) |
| (0 0 0 1) | ($l_1\,l_2\,l_1\,l_3\,l_4$) |
| (0 0 1 0) | ($l_1\,l_4\,l_2\,l_1\,l_3$) |
| (0 0 1 1) | ($l_1\,l_2\,l_3\,l_1\,l_4$) |
| (0 1 0 0) | ($l_2\,l_4\,l_1\,l_3\,l_1$) |
| (0 1 0 1) | ($l_1\,l_2\,l_3\,l_4\,l_1$) |
| (0 1 1 0) | ($l_2\,l_4\,l_3\,l_1\,l_1$) |
| (0 1 1 1) | ($l_1\,l_2\,l_4\,l_3\,l_1$) |
| (1 0 0 0) | ($l_4\,l_1\,l_1\,l_2\,l_3$) |
| (1 0 0 1) | ($l_2\,l_1\,l_1\,l_3\,l_4$) |
| (1 0 1 0) | ($l_4\,l_1\,l_2\,l_1\,l_3$) |
| (1 0 1 1) | ($l_2\,l_1\,l_3\,l_1\,l_4$) |
| (1 1 0 0) | ($l_4\,l_2\,l_1\,l_3\,l_1$) |
| (1 1 0 1) | ($l_2\,l_1\,l_3\,l_4\,l_1$) |
| (1 1 1 0) | ($l_4\,l_2\,l_3\,l_1\,l_1$) |
| (1 1 1 1) | ($l_2\,l_1\,l_4\,l_3\,l_1$) |

In one possible specific implementation of the coding scheme of Table 5, the voltage level $l_1$ is 0 volts, the voltage level $l_2$ is a specified non-zero voltage level, the voltage level $l_3$ is twice as high as the voltage level $l_2$, and the voltage level $l_4$ is three times as high as the voltage level $l_2$. In that case, the coding scheme of Table 5 can be represented as shown in Table 6, where "0" represents the zero voltage level $l_1$, "1" represents the non-zero voltage level $l_2$, "2" represents the non-zero voltage level $l_3$, and "3" represents the non-zero voltage level $l_4$. Note that the average transmit power for the coding scheme of Table 6 is (0+0+1+4+9)/5 or 2.8 power units per bit. Those skilled in the art will understand that, in alternative implementations, values other than 0-3 can be used for the voltage levels $l_1$-$l_4$, as long as they satisfy the condition that $l_1 < l_2 < l_3 < l_4$.

TABLE 6

SPECIFIC 4-BIT, 5-WIRE PAM4 CODING SCHEME

| ($b_4$ $b_3$ $b_2$ $b_1$) | ($w_5$ $w_4$ $w_3$ $w_2$ $w_1$) |
|---|---|
| (0 0 0 0) | (0 3 0 1 2) |
| (0 0 0 1) | (0 1 0 2 3) |
| (0 0 1 0) | (0 3 1 0 2) |
| (0 0 1 1) | (0 1 2 0 3) |
| (0 1 0 0) | (1 3 0 2 0) |
| (0 1 0 1) | (0 1 2 3 0) |
| (0 1 1 0) | (1 3 2 0 0) |
| (0 1 1 1) | (0 1 3 2 0) |
| (1 0 0 0) | (3 0 0 1 2) |
| (1 0 0 1) | (1 0 0 2 3) |
| (1 0 1 0) | (3 0 1 0 2) |
| (1 0 1 1) | (1 0 2 0 3) |
| (1 1 0 0) | (3 1 0 2 0) |
| (1 1 0 1) | (1 0 2 3 0) |
| (1 1 1 0) | (3 1 2 0 0) |
| (1 1 1 1) | (1 0 3 2 0) |

Note that, in the generalized coding scheme of Table 5, all sixteen different 4-bit values ($b_4$ $b_3$ $b_2$ $b_1$) are encoded using permutations of the same set of five voltage signals, where each permutation has exactly two voltage signals with voltage level $l_1$, exactly one voltage signal with voltage level $l_2$, exactly one voltage signal with voltage level $l_3$, and exactly one voltage signal with voltage level $l_4$. Similarly, in the specific coding scheme of Table 6, all sixteen different 4-bit values ($b_4$ $b_3$ $b_2$ $b_1$) are encoded using permutations of the same set of five voltage signals, where each permutation has exactly two voltage signals with voltage level 0, exactly one voltage signal with voltage level 1, exactly one voltage signal with voltage level 3, and exactly one voltage signal with voltage level 3.

Figure 6A:
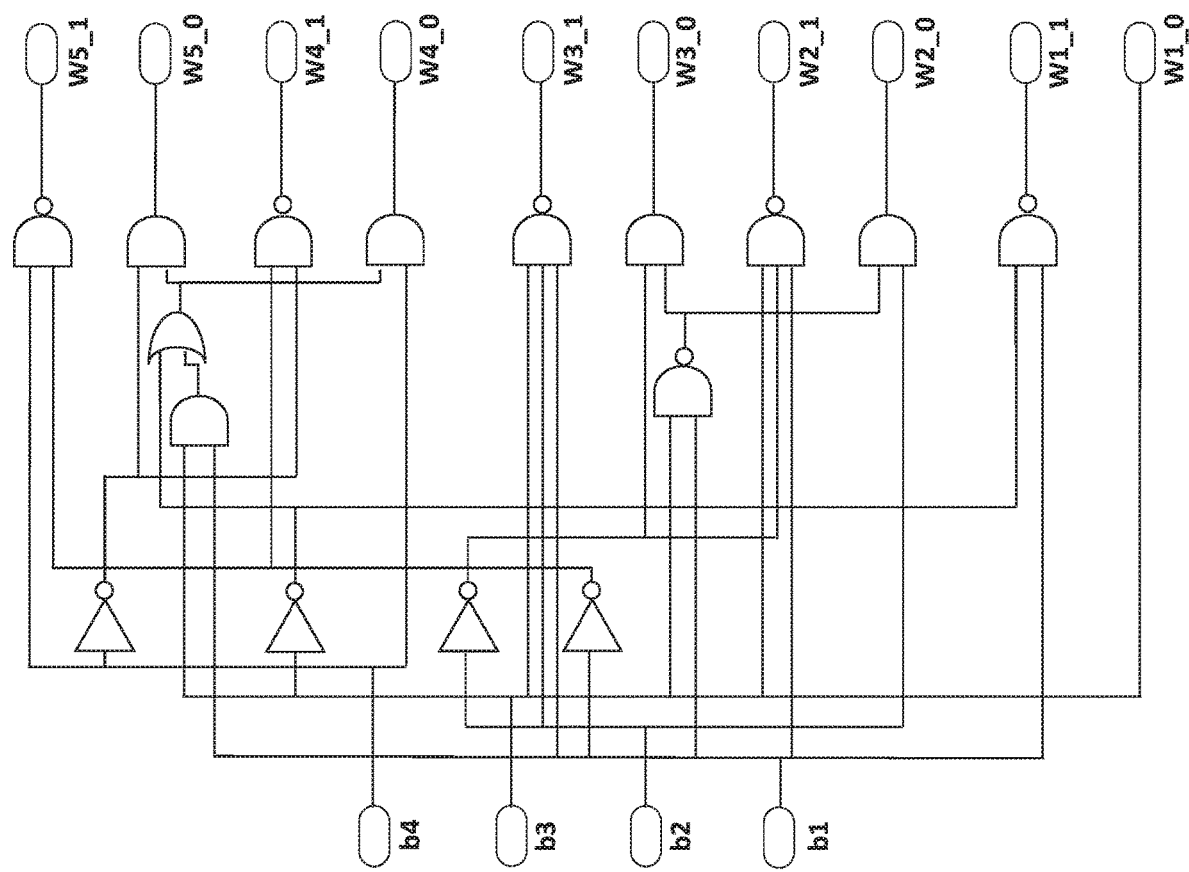
FIGS. 6A-6B are diagrams representing a two-stage implementation of the encoder 114 of FIG. 1 according to one possible embodiment for the 4b5w-PAM3 coding schemes of Tables 5 and 6.
Figure 6B:
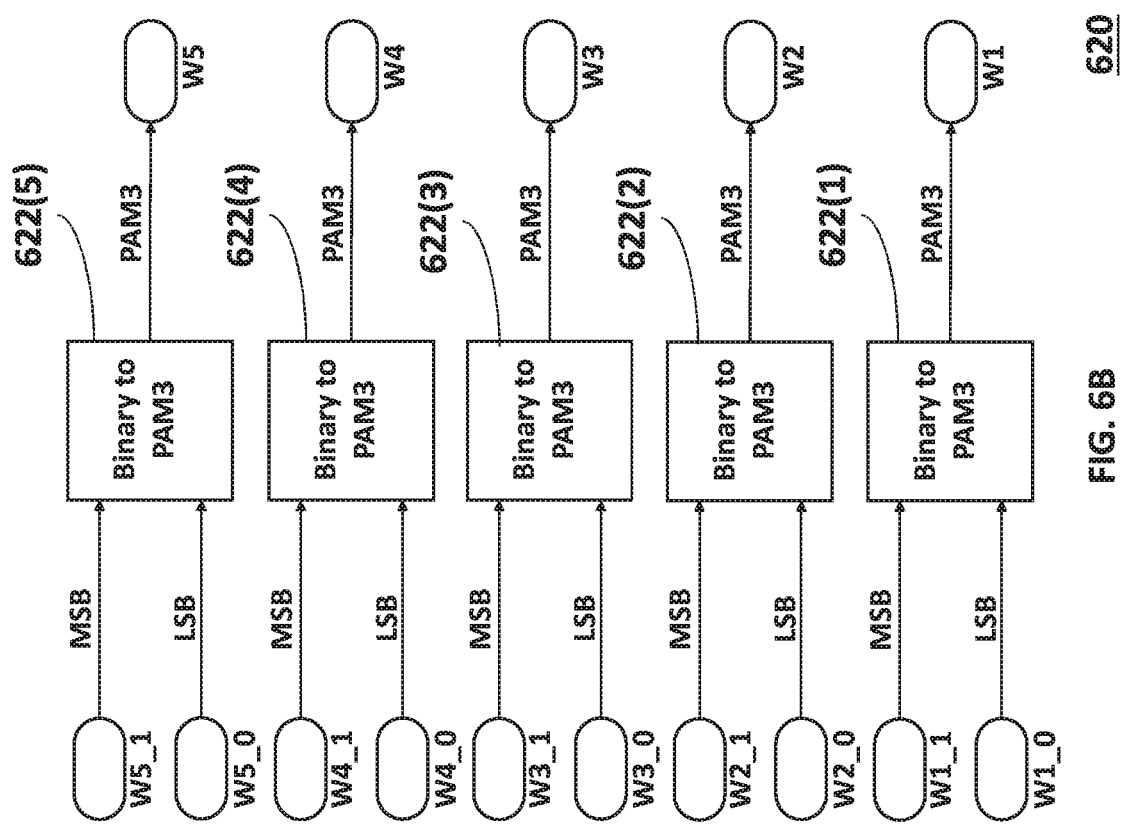

FIGS. 6A-6B are diagrams representing a two-stage implementation of the encoder 114 of FIG. 1 according to one possible embodiment for the 4b5w-PAM3 coding schemes of Tables 5 and 6, where FIG. 6A is a schematic circuit diagram of a first, binary coding stage 610 and FIG. 6B is a schematic block diagram of a second, binary-to-PAM3 coding stage 620. The binary coding stage 610 of FIG. 6A converts the four-bit value ($b_4$ $b_3$ $b_2$ $b_1$) into five two-bit binary values (wi_1, wi_0), where i=1-5. The binary-to-PAM3 coding stage 620 of FIG. 6B has five binary-to-PAM3 coders 622(1)-622(5), each of which converts a corresponding two-bit binary value (wi_1, wi_0) into a different one of the five PAM3 voltage signals $w_1$-$w_5$.

Figure 6C:
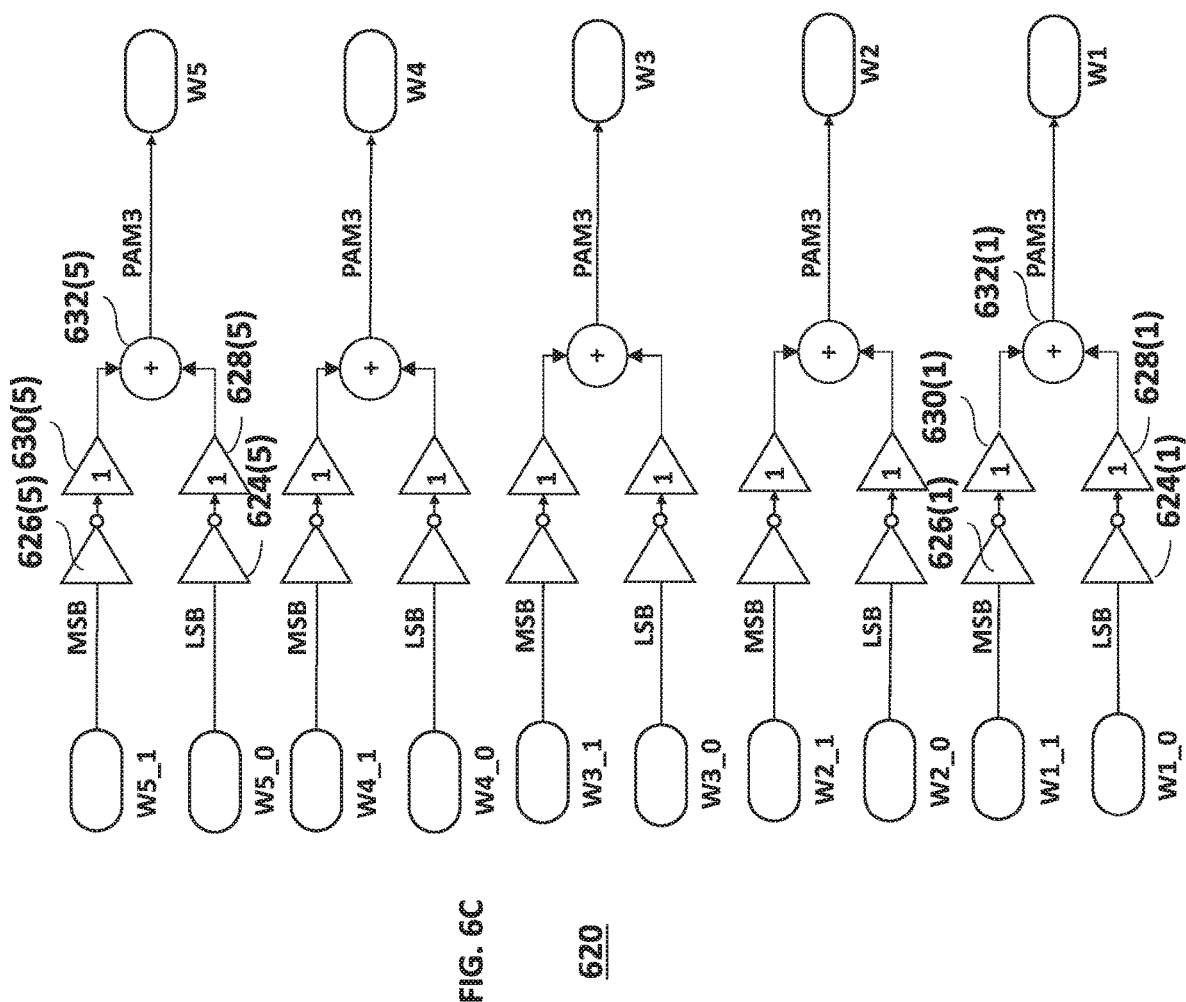
FIG. 6C is a schematic circuit diagram of the binary-to-PAM3 coding stage 620 of FIG. 6B for an implementation.

FIG. 6C is a schematic circuit diagram of the binary-to-PAM3 coding stage 620 of FIG. 6B for an implementation in which each binary-to-PAM3 coder 622(i) of FIG. 6B is implemented as a 2-bit digital-to-analog converter. Inverters 624(i) and 626(i) are used between the respective inputs wi_0 and wi_1 and two respective unity-gain amplifiers 628(i) and 630(i) for the LSB wi_0 and MSB wi_1 of the corresponding two-bit binary value (wi_0, wi_1). A summation 632(i) is performed on the resulting weighted values to generate the signal Wi.

Figure 6D:
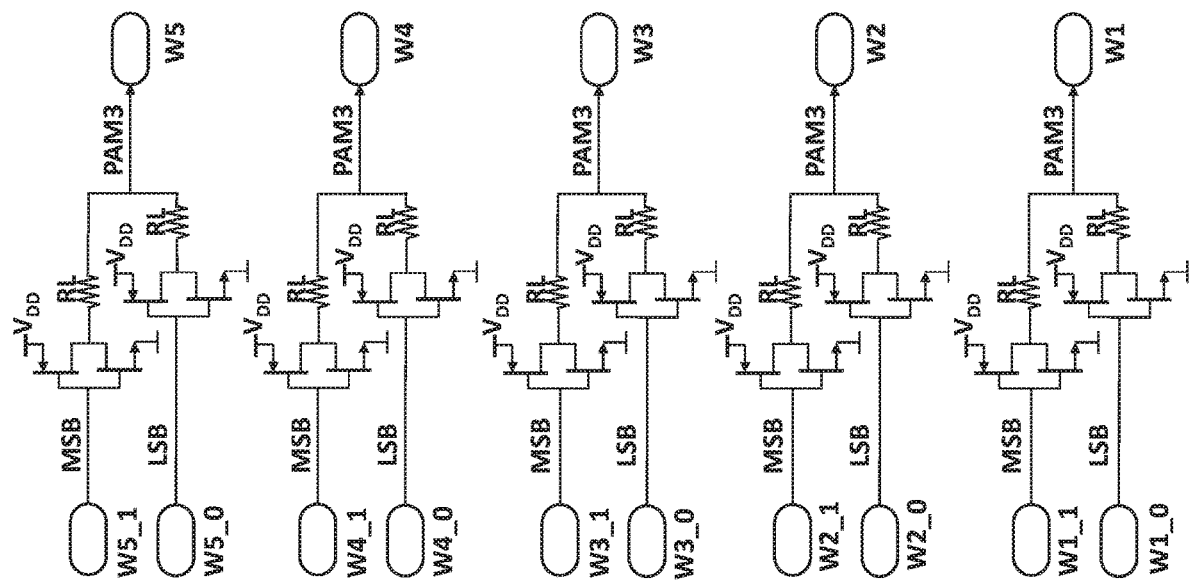
FIG. 6D is a schematic circuit diagram of the binary-to-PAM3 coding stage 620 of FIG. 6C for an implementation.

FIG. 6D is a schematic circuit diagram of the binary-to-PAM3 coding stage 620 of FIG. 6C for an implementation in which each combination of an inverter 624(i) and 626(i) and a respective amplifier 628(i) and 630(i) of FIG. 6C is implemented with an inverter and a corresponding resistor.

In order to decode the PAM3 voltage signals $w_1$-$w_5$ encoded using any specific implementation of the generalized coding scheme of Table 5, of which the coding scheme of Table 6 is one specific example, to recover the original 4-bit value ($b_4$ $b_3$ $b_2$ $b_1$), the decoder 134 of FIG. 1 can be designed to implement the same decoding equations as for the coding schemes of Tables 3 and 4 (i.e., Equations (5)-(8)). As such, the circuit diagrams of FIGS. 5A-5D can be used to implement the decoder 134 of FIG. 1 for the coding schemes of Tables 3 and 4.

Comparison of N-Bit, M-Wire PAM-Q Coding Schemes

The selection of a particular N-Bit, M-wire PAM-Q coding scheme for a particular application typically involves a trade-off between the mutually exclusive goals of high speed, on the one hand, and large signal-to-noise ratio, low power consumption, small encoder/decoder IC footprints, and low chip I/O pin count, on the other hand. In general, coding schemes with more bits being processed in parallel (i.e., larger N values) can have higher throughput and/or larger signal-to-noise ratio than coding schemes with fewer parallel bits, but at the cost of higher power consumption, larger footprints, and higher pin count. Furthermore, coding schemes with a greater number of wires per bit (i.e., larger M/N values) can have larger signal-to-noise ratio and/or can be simpler than coding schemes with smaller M/N values due to reduced inter-symbol interference, but at the cost of lower area efficiency, larger footprints, and higher pin count. In addition, coding schemes with more voltage levels for a set maximum voltage (i.e., larger Q values) can have more combinations to design simpler receivers, but at the cost of higher power consumption. Similarly, coding schemes with greater separations between voltage levels can have larger signal-to-noise ratio and/or can be faster than coding schemes with smaller separations due to reduced ISI, but at the cost of higher power consumption. Whether a particular N-bit, M-wire PAM-Q coding scheme is appropriate for a particular application will depend on the relative priorities for high speed, large signal-to-noise ratio, low power consumption, small footprints, and low pin count for that application.

The coding schemes described above may be compared and contrasted by their particular characteristics which may affect their suitability for particular applications. Although the sets vary for different coding schemes, each coding scheme described above is based on permutations of a single set of voltage signals. The coding scheme of Tables 1 and 2 is referred to as a 100% coding scheme because the number N of bits and the number M of wires are equal (i.e., N/M=4/4=>100%), while the coding schemes of Tables 3-6 are 80% coding schemes (i.e., N/M=4/5=>80%).

In general, the N bits can be recovered from the M voltage signals generated using any N-bit, M-wire PAM-Q coding scheme using an instance of the following equation:

$$\hat{b}_n = \sum_c \gamma_c^{(k)} \cdot 1\left(\sum_{m=1}^{M} \alpha_m^{(n,c)} \cdot w_m > \sum_{m=1}^{M} \beta_m^{(n,c)} \cdot w_m\right) 1 \leq n \leq N, \quad (9)$$

where:

$\hat{b}_n$ is the $n^{th}$ recovered bit;

$w_m$ is the relative amplitude of the voltage signal on the $m^{th}$ wire;

$\alpha_m^{(n,c)}$, $\beta_m^{(n,c)}$, and $\gamma_c^{(k)}$ are weighting values;

$$\sum_{m=1}^{M} \alpha_m^{(n,c)} \cdot w_m > \sum_{m=1}^{M} \beta_m^{(n,c)} \cdot w_m$$

are inner sums;

$$\left( \sum_{m=1}^{M} \alpha_m^{(n,c)} \cdot w_m > \sum_{m=1}^{M} \beta_m^{(n,c)} \cdot w_m \right)$$

is a comparison;

$$1\left( \sum_{m=1}^{M} \alpha_m^{(n,c)} \cdot w_m > \sum_{m=1}^{M} \beta_m^{(n,c)} \cdot w_m \right)$$

is 1 if the comparison relation is true, and is 0 otherwise; and $$\Sigma_c \gamma_c^{(k)} \cdot 1\left( \sum_{m=1}^{M} \alpha_m^{(n,c)} \cdot w_m > \sum_{m=1}^{M} \beta_m^{(n,c)} \cdot w_m \right)$$

is an outer sum.

Thus, Equation (9) can be implemented by a decoder having an initial computation stage that performs the inner sums of Equation (9), followed by a comparison stage that performs the comparisons of Equation (9), followed by a second computation stage that performs the outer sums of Equation (9).

Note that, in the coding schemes of Tables 1 and 2, each voltage level appears only one time in each code. On the other hand, in the coding schemes of Tables 3 and 4, two different voltage levels (i.e., $l_1$ and $l_2$ of Table 3) appear twice in each code, and, in the coding schemes of Tables 5 and 6, one of the voltage levels (i.e., $l_1$ of Table 5) appears twice in each code.

The decoder 134 for the coding schemes of Tables 1 and 2 shown in FIG. 3A has only two stages (i.e., the initial comparison stage 310 followed by the computation stage 320). The decoder 134 for the coding schemes of Tables 1 and 2 shown in FIG. 3B also has only two stages (i.e., the initial comparison stage 310 followed by the logic stage 320). The decoders 134 for the coding schemes of Tables 3-6 shown in FIGS. 5A-5C also have only two stages (i.e., the initial computation stage 510 followed by the comparison stage 520). The decoder 134 for the coding schemes of Tables 3-6 shown in FIG. 5D has only comparison stage 530.

According to certain embodiments, an article of manufacture comprises an encoder for encoding data according to a coding scheme. The encoder comprises a first coding stage configured to convert N bits $b_1$-$b_N$ of input data into P bits of intermediate data and a second coding stage configured to convert the P bits of intermediate data into M voltage signals $w_1$-$w_M$ for transmission over M parallel wires to a decoder. The coding scheme is an N-bit, M-wire PAM-Q code in which (i) each N-bit input value is encoded as a set of M voltage signals $w_1$-$w_M$, (ii) each voltage signal $w_i$ has one of Q voltage levels $l_1$-$l_Q$, where $l_1 < l_2 < \ldots < l_Q$, and (iii) the different sets of M voltage signals $w_1$-$w_M$ for the different N-bit input values are permutations of a single set of M voltage signals. For each N-bit input, the M voltage signals are decodable by the decoder having a comparator stage and no more than one other decoding stage, wherein, for the decoder having one other decoding stage, the other decoding stage is a computation stage or a logic stage that is before or after the comparator stage.

According to certain embodiments, an article of manufacture comprises a decoder for decoding signals generated using a coding scheme. The decoder comprises one or two decoding stages including a first decoding stage. The first decoding stage is configured to receive M voltage signals $w_1$-$w_M$ from M parallel wires. The decoder is configured to recover N bits $b_1$-$b_N$ of data from the M voltage signals $w_1$-$w_M$. The coding scheme is an N-bit, M-wire PAM-Q code in which (i) each N-bit input value is encoded as a set of M voltage signals $w_1$-$w_M$, (ii) each voltage signal $w_i$ has one of Q voltage levels $l_1$-$l_Q$, where $l_1 < l_2 < \ldots < l_Q$, and (iii) the different sets of M voltage signals $w_1$-$w_M$ for the different N-bit input values are permutations of a single set of M voltage signals. The M voltage signals $w_1$-$w_M$ are decodable by the decoder having a comparator stage and no more than one other decoding stage, wherein, for the decoder having one other decoding stage, the other decoding stage is a computation stage or a logic stage that is before or after the comparator stage.

According to certain embodiments of the some or all of above, N=M.

According to certain embodiment of some or all of the above, N=M=4.

According to certain embodiments of some or all of the above, N=M=Q.

According to certain embodiments of some or all of the above, N=M=Q=4.

According to certain embodiments of some or all of the above, the 4-bit, 4-wire PAM4 code is represented according to Table 1.

According to certain embodiments of some or all of the above, the decoder comprises a comparator stage followed by a computation stage.

According to certain embodiments of some or all of the above, the decoder decodes the 4 voltage signals $w_1$-$w_4$ according to:

$b_4 = 1(w_4 > w_3)$;

$b_3 = 1(w_3 > w_2)$;

$b_2 = 1(w_3 > w_1)$; and $b_1 = 1(w_2 > w_1) + 1(w_4 > w_2) - 1(w_4 > w_1)$.

According to certain embodiments of some or all of the above, the decoder comprises a comparator stage followed by a logic stage.

According to certain embodiments of some or all of the above, the decoder decodes the 4 voltage signals $w_1$-$w_4$ according to:

$b_4 = 1(w_4 > w_3)$;

$b_3 = 1(w_3 > w_2)$;

$b_2 = 1(w_3 > w_1)$; and $b_1 = 1(w_2 > w_1) \text{XOR} 1(w_4 > w_2) \text{XOR} 1(w_4 > w_1)$.

According to certain embodiments of some or all of the above, N=M−1.

According to certain embodiments of some or all of the above, N=4 and M=5.

According to certain embodiments of some or all of the above, N=M−1=Q+1.

According to certain embodiments of some or all of the above, N=4, M=5, and Q=3.

According to certain embodiments of some or all of the above, the 4-bit, 5-wire PAM3 code is represented according to Table 3.

According to certain embodiments of some or all of the above, the decoder comprises a computation stage followed by a comparator stage.

According to certain embodiments of some or all of the above, the decoder decodes the 5 voltage signals $w_1$-$w_5$ according to:

$$b_4=1(w_5>w_4);$$

$$b_3=1((w_3+w_2)/2>w_1);$$

$$b_2=1(w_3>w_2); \text{ and}$$

$$b_1=1((w_1+w_2+w_3)/3>(w_4+w_5)/2.$$

According to certain embodiments of some or all of the above, N=M−1=Q.

According to certain embodiments of some or all of the above, N=4, M=5, and Q=4.

According to certain embodiments of some or all of the above, the 4-bit, 5-wire PAM4 code is represented according to Table 5.

According to certain embodiments of some or all of the above, the decoder comprises a computation stage followed by a comparator stage.

According to certain embodiments of some or all of the above, the decoder decodes the 5 voltage signals $w_1$-$w_5$ according to:

$$b_4=1(w_5>w_4);$$

$$b_3=1((w_3+w_2)/2>w_1);$$

$$b_2=1(w_3>w_2); \text{ and}$$

$$b_1=1((w_1+w_2+w_3)/3>(w_4+w_5)/2.$$

Although embodiments have been described in the context of the coding schemes of Tables 1-6, those skilled in the art will understand that other embodiments may be implemented in the context of other suitable coding schemes.

Although embodiments have been described in the context of coding schemes that can be decoded using a decoder having a comparator stage and only one other decoding stage (e.g., a computation stage or a logic stage that is before or after the comparator stage), those skilled in the art will understand that other embodiments may be implemented in the context of other suitable coding schemes that can be decoded using a decoder having only a comparator stage.

Although embodiments have been described in the context of chip-to-chip communication, those skilled in the art will understand that other embodiments may be implemented for other suitable types of communications between transmitters and receivers.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this disclosure may be made by those skilled in the art without departing from embodiments of the disclosure encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

As used herein and in the claims, the term "provide" with respect to an apparatus or with respect to a system, device, or component encompasses designing or fabricating the apparatus, system, device, or component; causing the apparatus, system, device, or component to be designed or fabricated; and/or obtaining the apparatus, system, device, or component by purchase, lease, rental, or other contractual arrangement.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:

1. An article of manufacture comprising an encoder for encoding data according to a coding scheme, the encoder comprising:

a first coding stage configured to convert N bits $b_1$-$b_N$ of input data into P bits of intermediate data; and a second coding stage configured to convert the P bits of intermediate data into M voltage signals $w_1$-$w_M$ for transmission over M parallel wires to a decoder, wherein:

the coding scheme is an N-bit, M-wire PAM-Q code in which (i) each N-bit input value is encoded as a set of M voltage signals $w_1$-$w_M$, (ii) each voltage signal $w_i$ has one of Q voltage levels $l_1$-$l_Q$, where $l_1 < l_2 < \ldots < l_Q$, and (iii) the different sets of M voltage signals $w_1$-$w_M$ for the different N-bit input values are permutations of a single set of M voltage signals; and for each N-bit input, the M voltage signals are decodable by the decoder having a comparator stage and no more than one other decoding stage, wherein, for the decoder having one other decoding stage, the other decoding stage is a computation stage or a logic stage that is before or after the comparator stage.

2. The article of claim 1, wherein N=M=Q=4.

3. The article of claim 2, wherein the 4-bit, 4-wire PAM4 code is represented as:

| ($b_4$ $b_3$ $b_2$ $b_1$) | ($w_4$ $w_3$ $w_2$ $w_1$) |
|---|---|
| (0 0 0 0) | ($l_1$ $l_2$ $l_3$ $l_4$) |
| (0 0 0 1) | ($l_1$ $l_2$ $l_4$ $l_3$) |
| (0 0 1 0) | ($l_2$ $l_3$ $l_4$ $l_1$) |
| (0 0 1 1) | ($l_1$ $l_3$ $l_4$ $l_2$) |
| (0 1 0 0) | ($l_1$ $l_3$ $l_2$ $l_4$) |
| (0 1 0 1) | ($l_2$ $l_3$ $l_1$ $l_4$) |
| (0 1 1 0) | ($l_1$ $l_4$ $l_2$ $l_3$); ($l_2$ $l_4$ $l_3$ $l_1$); ($l_3$ $l_4$ $l_1$ $l_2$) |
| (0 1 1 1) | ($l_1$ $l_4$ $l_3$ $l_2$); ($l_2$ $l_4$ $l_1$ $l_3$); ($l_3$ $l_4$ $l_2$ $l_1$) |
| (1 0 0 0) | ($l_4$ $l_1$ $l_2$ $l_3$); ($l_2$ $l_1$ $l_3$ $l_4$); ($l_3$ $l_1$ $l_4$ $l_2$) |
| (1 0 0 1) | ($l_4$ $l_1$ $l_3$ $l_2$); ($l_3$ $l_1$ $l_2$ $l_4$); ($l_2$ $l_1$ $l_4$ $l_3$) |
| (1 0 1 0) | ($l_3$ $l_2$ $l_4$ $l_1$) |
| (1 0 1 1) | ($l_4$ $l_2$ $l_3$ $l_1$) |
| (1 1 0 0) | ($l_4$ $l_2$ $l_1$ $l_3$) |
| (1 1 0 1) | ($l_3$ $l_2$ $l_1$ $l_4$) |
| (1 1 1 0) | ($l_4$ $l_3$ $l_1$ $l_2$) |
| (1 1 1 1) | ($l_4$ $l_3$ $l_2$ $l_1$). |

4. The article of claim 1, wherein N=4, M=5, and Q=3.

5. The article of claim 4, wherein the 4-bit, 5-wire PAM3 code is represented as:

| ($b_4$ $b_3$ $b_2$ $b_1$) | ($w_5$ $w_4$ $w_3$ $w_2$ $w_1$) |
|---|---|
| (0 0 0 0) | ($l_1$ $l_3$ $l_1$ $l_2$ $l_2$) |
| (0 0 0 1) | ($l_1$ $l_2$ $l_1$ $l_2$ $l_3$) |
| (0 0 1 0) | ($l_1$ $l_3$ $l_2$ $l_1$ $l_2$) |
| (0 0 1 1) | ($l_1$ $l_2$ $l_2$ $l_1$ $l_3$) |
| (0 1 0 0) | ($l_2$ $l_3$ $l_1$ $l_2$ $l_1$) |
| (0 1 0 1) | ($l_1$ $l_2$ $l_2$ $l_3$ $l_1$) |
| (0 1 1 0) | ($l_2$ $l_3$ $l_2$ $l_1$ $l_1$) |
| (0 1 1 1) | ($l_1$ $l_2$ $l_3$ $l_2$ $l_1$) |
| (1 0 0 0) | ($l_3$ $l_1$ $l_1$ $l_2$ $l_2$) |
| (1 0 0 1) | ($l_2$ $l_1$ $l_1$ $l_2$ $l_3$) |
| (1 0 1 0) | ($l_3$ $l_1$ $l_2$ $l_1$ $l_2$) |
| (1 0 1 1) | ($l_2$ $l_1$ $l_2$ $l_1$ $l_3$) |
| (1 1 0 0) | ($l_3$ $l_2$ $l_1$ $l_2$ $l_1$) |
| (1 1 0 1) | ($l_2$ $l_1$ $l_2$ $l_3$ $l_1$) |
| (1 1 1 0) | ($l_3$ $l_2$ $l_2$ $l_1$ $l_1$) |
| (1 1 1 1) | ($l_2$ $l_1$ $l_3$ $l_2$ $l_1$). |

6. The article of claim 1, wherein N=4, M=5, and Q=4.

7. The article of claim 6, wherein the 4-bit, 5-wire PAM4 code is represented as:

| ($b_4$ $b_3$ $b_2$ $b_1$) | ($w_5$ $w_4$ $w_3$ $w_2$ $w_1$) |
|---|---|
| (0 0 0 0) | ($l_1$ $l_4$ $l_1$ $l_2$ $l_3$) |
| (0 0 0 1) | ($l_1$ $l_2$ $l_1$ $l_3$ $l_4$) |
| (0 0 1 0) | ($l_1$ $l_4$ $l_2$ $l_1$ $l_3$) |
| (0 0 1 1) | ($l_1$ $l_2$ $l_3$ $l_1$ $l_4$) |
| (0 1 0 0) | ($l_2$ $l_4$ $l_3$ $l_1$ $l_1$) |
| (0 1 0 1) | ($l_1$ $l_2$ $l_3$ $l_4$ $l_1$) |
| (0 1 1 0) | ($l_2$ $l_4$ $l_3$ $l_1$ $l_1$) |
| (0 1 1 1) | ($l_1$ $l_2$ $l_4$ $l_3$ $l_1$) |
| (1 0 0 0) | ($l_4$ $l_1$ $l_1$ $l_2$ $l_3$) |
| (1 0 0 1) | ($l_2$ $l_1$ $l_1$ $l_3$ $l_4$) |
| (1 0 1 0) | ($l_4$ $l_1$ $l_2$ $l_1$ $l_3$) |
| (1 0 1 1) | ($l_2$ $l_1$ $l_3$ $l_1$ $l_4$) |
| (1 1 0 0) | ($l_4$ $l_2$ $l_1$ $l_3$ $l_1$) |
| (1 1 0 1) | ($l_2$ $l_1$ $l_3$ $l_4$ $l_1$) |
| (1 1 1 0) | ($l_4$ $l_2$ $l_3$ $l_1$ $l_1$) |
| (1 1 1 1) | ($l_2$ $l_1$ $l_4$ $l_3$ $l_1$). |

8. The article of claim 1, wherein each voltage level appears only one time in each code.

9. The article of claim 1, wherein two different voltage levels appear twice in each code.

10. The article of claim 1, wherein one of the voltage levels appears twice in each code.

11. An article of manufacture comprising a decoder for decoding signals generated using a coding scheme, the decoder comprising one or two decoding stages including a first decoding stage, wherein:
the first decoding stage is configured to receive M voltage signals $w_1$-$w_M$ from M parallel wires;
the decoder is configured to recover N bits $b_1$-$b_N$ of data from the M voltage signals $w_1$-$w_M$;
the coding scheme is an N-bit, M-wire PAM-Q code in which (i) each N-bit input value is encoded as a set of M voltage signals $w_1$-$w_M$, (ii) each voltage signal $w_i$ has one of Q voltage levels $l_1$-$l_Q$, where $l_1 < l_2 < \ldots < l_Q$, and (iii) the different sets of M voltage signals $w_1$-$w_M$ for the different N-bit input values are permutations of a single set of M voltage signals; and
the M voltage signals $w_1$-$w_M$ are decodable by the decoder having a comparator stage and no more than one other decoding stage, wherein, for the decoder having one other decoding stage, the other decoding stage is a computation stage or a logic stage that is before or after the comparator stage.

12. The article of claim 11, wherein N=M=Q=4.

13. The article of claim 12, wherein the 4-bit, 4-wire PAM4 code is represented as:

| ($b_4$ $b_3$ $b_2$ $b_1$) | ($w_4$ $w_3$ $w_2$ $w_1$) |
|---|---|
| (0 0 0 0) | ($l_1$ $l_2$ $l_3$ $l_4$) |
| (0 0 0 1) | ($l_1$ $l_2$ $l_4$ $l_3$) |
| (0 0 1 0) | ($l_2$ $l_3$ $l_4$ $l_1$) |
| (0 0 1 1) | ($l_1$ $l_3$ $l_4$ $l_2$) |
| (0 1 0 0) | ($l_1$ $l_3$ $l_2$ $l_4$) |
| (0 1 0 1) | ($l_2$ $l_3$ $l_1$ $l_4$) |
| (0 1 1 0) | ($l_1$ $l_4$ $l_2$ $l_3$); ($l_2$ $l_4$ $l_3$ $l_1$); ($l_3$ $l_4$ $l_1$ $l_2$) |
| (0 1 1 1) | ($l_1$ $l_4$ $l_3$ $l_2$); ($l_2$ $l_4$ $l_1$ $l_3$); ($l_3$ $l_4$ $l_2$ $l_1$) |
| (1 0 0 0) | ($l_4$ $l_1$ $l_2$ $l_3$); ($l_2$ $l_1$ $l_3$ $l_4$); ($l_3$ $l_1$ $l_4$ $l_2$) |
| (1 0 0 1) | ($l_4$ $l_1$ $l_3$ $l_2$); ($l_3$ $l_1$ $l_2$ $l_4$); ($l_2$ $l_1$ $l_4$ $l_3$) |
| (1 0 1 0) | ($l_3$ $l_2$ $l_4$ $l_1$) |
| (1 0 1 1) | ($l_4$ $l_2$ $l_3$ $l_1$) |
| (1 1 0 0) | ($l_4$ $l_2$ $l_1$ $l_3$) |
| (1 1 0 1) | ($l_3$ $l_2$ $l_1$ $l_4$) |
| (1 1 1 0) | ($l_4$ $l_3$ $l_1$ $l_2$) |
| (1 1 1 1) | ($l_4$ $l_3$ $l_2$ $l_1$). |

14. The article of claim 13, wherein the decoder comprises a comparator stage followed by a computation stage.

15. The article of claim 14, wherein the decoder decodes the 4 voltage signals $w_1$-$w_4$ according to:

$$b_4 = 1(w_4 > w_3);$$

$$b_3 = 1(w_3 > w_2);$$

$$b_2 = 1(w_3 > w_1); \text{ and}$$

$$b_1 = 1(w_2 > w_1) + 1(w_4 > w_2) - 1(w_4 > w_1).$$

16. The article of claim 13, wherein the decoder comprises a comparator stage followed by a logic stage.

17. The article of claim 16, wherein the decoder decodes the 4 voltage signals according to:

$b_4=1(w_4>w_3);$ $b_3=1(w_3>w_2);$ $b_2=1(w_3>w_1);$ and $b_1=1(w_2>w_1)\text{XOR}1(w_4>w_2)\text{XOR}1(w_4>w_1).$ 18. The article of claim 11, wherein N=4, M=5, and Q=3.

19. The article of claim 18, wherein the 4-bit, 5-wire PAM3 code is represented as:

| $(b_4\ b_3\ b_2\ b_1)$ | $(w_5\ w_4\ w_3\ w_2\ w_1)$ |
|---|---|
| (0 0 0 0) | $(l_1\ l_3\ l_1\ l_2\ l_2)$ |
| (0 0 0 1) | $(l_1\ l_2\ l_1\ l_2\ l_3)$ |
| (0 0 1 0) | $(l_1\ l_3\ l_2\ l_1\ l_2)$ |
| (0 0 1 1) | $(l_1\ l_2\ l_2\ l_1\ l_3)$ |
| (0 1 0 0) | $(l_2\ l_3\ l_1\ l_2\ l_1)$ |
| (0 1 0 1) | $(l_1\ l_2\ l_3\ l_2\ l_1)$ |
| (0 1 1 0) | $(l_2\ l_3\ l_2\ l_1\ l_1)$ |
| (0 1 1 1) | $(l_1\ l_2\ l_3\ l_2\ l_1)$ |
| (1 0 0 0) | $(l_3\ l_1\ l_1\ l_2\ l_2)$ |
| (1 0 0 1) | $(l_2\ l_1\ l_1\ l_2\ l_3)$ |
| (1 0 1 0) | $(l_3\ l_1\ l_2\ l_1\ l_2)$ |
| (1 0 1 1) | $(l_2\ l_1\ l_2\ l_1\ l_3)$ |
| (1 1 0 0) | $(l_3\ l_2\ l_1\ l_2\ l_1)$ |
| (1 1 0 1) | $(l_2\ l_1\ l_2\ l_3\ l_1)$ |
| (1 1 1 0) | $(l_3\ l_2\ l_2\ l_1\ l_1)$ |
| (1 1 1 1) | $(l_2\ l_1\ l_3\ l_2\ l_1).$ |

20. The article of claim 19, wherein the decoder comprises a computation stage followed by a comparator stage.

21. The article of claim 20, wherein the decoder decodes the 5 voltage signals according to:

$b_4=1(w_5>w_4);$ $b_3=1((w_3+w_2)/2>w_1);$ $b_2=1(w_3>w_2);$ and $b_1=1((w_1+w_2+w_3)/3>(w_4+w_5)/2.$ 22. The article of claim 11, wherein N=4, M=5, and Q=4.

23. The article of claim 22, wherein the 4-bit, 5-wire PAM4 code is represented as:

| $(b_4\ b_3\ b_2\ b_1)$ | $(w_5\ w_4\ w_3\ w_2\ w_1)$ |
|---|---|
| (0 0 0 0) | $(l_1\ l_4\ l_1\ l_2\ l_3)$ |
| (0 0 0 1) | $(l_1\ l_2\ l_1\ l_3\ l_4)$ |
| (0 0 1 0) | $(l_1\ l_4\ l_2\ l_1\ l_3)$ |
| (0 0 1 1) | $(l_1\ l_2\ l_3\ l_1\ l_4)$ |
| (0 1 0 0) | $(l_2\ l_4\ l_1\ l_1\ l_3)$ |
| (0 1 0 1) | $(l_1\ l_2\ l_3\ l_4\ l_1)$ |
| (0 1 1 0) | $(l_2\ l_4\ l_3\ l_1\ l_1)$ |
| (0 1 1 1) | $(l_1\ l_2\ l_4\ l_3\ l_1)$ |
| (1 0 0 0) | $(l_4\ l_1\ l_1\ l_2\ l_3)$ |
| (1 0 0 1) | $(l_2\ l_1\ l_1\ l_3\ l_4)$ |
| (1 0 1 0) | $(l_4\ l_1\ l_2\ l_1\ l_3)$ |
| (1 0 1 1) | $(l_2\ l_1\ l_3\ l_1\ l_4)$ |
| (1 1 0 0) | $(l_4\ l_2\ l_1\ l_3\ l_1)$ |
| (1 1 0 1) | $(l_2\ l_1\ l_3\ l_4\ l_1)$ |
| (1 1 1 0) | $(l_4\ l_2\ l_3\ l_1\ l_1)$ |
| (1 1 1 1) | $(l_2\ l_1\ l_4\ l_3\ l_1).$ |

24. The article of claim 23, wherein the decoder comprises a computation stage followed by a comparator stage.

25. The article of claim 24, wherein the decoder decodes the 5 voltage signals according to:

$b_4=1(w_5>w_4);$ $b_3=1((w_3+w_2)/2>w_1);$ $b_2=1(w_3>w_2);$ and $b_1=1((w_1+w_2+w_3)/3>(w_4+w_5)/2.$ 26. The article of claim 11, wherein each voltage level appears only one time in each code.

27. The article of claim 11, wherein two different voltage levels appear twice in each code.

28. The article of claim 11, wherein one of the voltage levels appears twice in each code.

29. The article of claim 11, wherein the decoder is configured to recover the N bits from the M voltage signals generated using the coding scheme using an instance of the following equation:

$$\hat{b}_n = \sum_c \gamma_c^{(k)} \cdot 1\left(\sum_{m=1}^M \alpha_m^{(n,c)} \cdot w_m > \sum_{m=1}^M \beta_m^{(n,c)} \cdot w_m\right), 1 \le n \le N$$

wherein:

$\hat{b}_n$ is the $n^{th}$ recovered bit;

$w_m$ is the relative amplitude of the voltage signal on the $m^{th}$ wire;

$\alpha_m^{(n,c)}$, $\beta_m^{(n,c)}$, and $\gamma_c^{(k)}$ are weighting values;

$$\sum_{m=1}^M \alpha_m^{(n,c)} \cdot w_m \text{ and } \sum_{m=1}^M \beta_m^{(n,c)} \cdot w_m$$

are inner sums;

$$\left(\sum_{m=1}^M \alpha_m^{(n,c)} \cdot w_m > \sum_{m=1}^M \beta_m^{(n,c)} \cdot w_m\right)$$

is a comparison;

$$1\left(\sum_{m=1}^M \alpha_m^{(n,c)} \cdot w_m > \sum_{m=1}^M \beta_m^{(n,c)} \cdot w_m\right)$$

is 1 if the comparison relation is true, and is 0 otherwise; and $$\sum_c \gamma_c^{(k)} \cdot 1\left(\sum_{m=1}^M \alpha_m^{(n,c)} \cdot w_m > \sum_{m=1}^M \beta_m^{(n,c)} \cdot w_m\right)$$

is an outer sum.

30. The article of claim 29, wherein the decoder comprises an initial computation stage that performs the inner sums, followed by a comparison stage that performs the comparisons, followed by a second computation stage that performs the outer sums.

* * * * *

UNITED STATES PATENT AND TRADEMARK OFFICE
CERTIFICATE OF CORRECTION

PATENT NO. : 11,133,874 B2
APPLICATION NO. : 16/752542
DATED : September 28, 2021
INVENTOR(S) : Ariel Leonardo Vera Villarroel et al.

It is certified that error appears in the above-identified patent and that said Letters Patent is hereby corrected as shown below:

In the Claims

Column 18, Line 20 In Claim 29, please replace " $\hat{b}_n = \sum_c \gamma_c^{(k)} \cdot 1\left(\sum_{m=1}^{M} \alpha_m^{(n,c)} \cdot w_m > \sum_{m=1}^{M} \beta_m^{(nc)} \cdot w_m\right), \quad 1 \leq n \leq N$ "

with -- $\hat{b}_n = \sum_c \gamma_c^{(k)} \cdot 1\left(\sum_{m=1}^{M} \alpha_m^{(n,c)} \cdot w_m > \sum_{m=1}^{M} \beta_m^{(n,c)} \cdot w_m\right), \quad 1 \leq n \leq N$ --.

Column 18, Line 50 In Claim 29, please replace "1 if the comparison relation is true, and is 0 otherwise; and" with --1 if the comparison is true, and is 0 otherwise; and--.

Signed and Sealed this
Fourteenth Day of March, 2023

*Katherine Kelly Vidal*
Director of the United States Patent and Trademark Office